(12) United States Patent  (10) Patent No.: US 8,201,131 B2
Rajski et al.  (45) Date of Patent: Jun. 12, 2012

(54) GENERATING TEST PATTERNS HAVING ENHANCED COVERAGE OF UNTARGETED DEFECTS

(75) Inventors: Janusz Rajski, West Linn, OR (US); Huaxing Tang, Wilsonville, OR (US); Chen Wang, Tigard, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 467 days.

(21) Appl. No.: 12/404,583

(22) Filed: Mar. 16, 2009

(65) Prior Publication Data

US 2009/0183128 A1  Jul. 16, 2009

Related U.S. Application Data

(62) Division of application No. 10/979,496, filed on Nov. 1, 2004, now Pat. No. 7,509,600.

(60) Provisional application No. 60/564,742, filed on Apr. 22, 2004, provisional application No. 60/608,661, filed on Sep. 10, 2004.

(51) Int. Cl.
*G06F 17/50* (2006.01)
(52) U.S. Cl. ........................................ 716/136; 716/106
(58) Field of Classification Search .................. 716/106, 716/136; 714/718, 726, 727, 728, 729, 738, 714/739, 742
See application file for complete search history.

(56) References Cited

U.S. PATENT DOCUMENTS

| | | | |
|---|---|---|---|
| 6,334,199 B1 | 12/2001 | Ono et al. | |
| 6,385,750 B1 | 5/2002 | Kapur et al. | |
| 6,560,736 B2 | 5/2003 | Ferguson et al. | |
| 6,658,616 B1 | 12/2003 | Chang et al. | |
| 6,707,313 B1 * | 3/2004 | Rohrbaugh et al. | 324/762.02 |
| 6,830,867 B2 | 12/2004 | Kodama | |
| 6,950,974 B1 | 9/2005 | Wohl et al. | |
| 7,178,078 B2 | 2/2007 | Hiraide et al. | |
| 7,509,600 B2 | 3/2009 | Rajski et al. | |
| 2001/0003427 A1 * | 6/2001 | Ferguson et al. | 324/765 |

OTHER PUBLICATIONS

Abramovici et al., "A Practical Approach to Fault Simulations and Test Generation for Bridging Faults," *IEEE Transactions on Computers*, vol. c-34, No. 7, pp. 658-663 (Jul. 1985).

Acken et al., "Accurate modeling and simulation of bridging faults," *Proc. Custom Integrated Circuits Conf.*, pp. 17.4/1-17.4/4 (1991).

Acken et al., "Fault model evolution for diagnosis: accuracy vs. precision," *Proc. Custom Integrated Circuits Conf.*, pp. 13.4.1-13.4.4 (1992).

(Continued)

*Primary Examiner* — Vuthe Siek
(74) *Attorney, Agent, or Firm* — Klarquist Sparkman, LLP

(57) ABSTRACT

Disclosed below are representative embodiments of methods, apparatus, and systems for generating test patterns having an increased ability to detect untargeted defects. In one exemplary embodiment, for instance, one or more deterministic test values for testing targeted faults (e.g., stuck-at faults or bridging faults) in an integrated circuit design are determined. Additional test values that increase detectability of one or more untargeted defects during testing are determined. One or more test patterns are created that include at least a portion of the deterministic test values and at least a portion of the additional test values. Computer-readable media comprising computer-executable instructions for causing a computer to perform any of the disclosed methods or comprising test patterns generated by any of the disclosed embodiments are also disclosed.

24 Claims, 10 Drawing Sheets

OTHER PUBLICATIONS

Baker et al., "Defect-based delay testing of resistive vias-contacts: a critical evaluation," *Proc. Int. Test Conf.*, pp. 467-476 (1999).
Benware et al., "Impact of multiple-detect test patterns on product quality," *Proc. Int. Test Conf.*, pp. 1031-1040 (2003).
Blanton et al., "Analyzing the effectiveness of multiple-detect test sets," *Proc. Int. Test Conf.*, pp. 876-885 (2003).
Chakravarty et al., "Experimental evaluation of scan tests for bridges," *Proc. Int. Test Conf.*, pp. 509-518 (2002).
Chakravarty et al., "Fault models for speed failures caused by bridges and opens," *Proc. VLSI Test Symp.*, pp. 373-378 (2002).
Chess et al., "Generating test patterns for bridge faults in CMOS ICs," *Proc. European Design and Test Conf.*, pp. 165-170 (1994).
Chess et al., "Logic testing of bridging faults in CMOS integrated circuits," *IEEE Trans. Computers*, vol. 47, No. 3, pp. 338-345 (1998).
Dworak et al., "Balanced excitation and its effect on the fortuitous detection of dynamic defects," *Proc. DATE*, vol. 2, pp. 1066-1071 (2004).
Dworak et al., "Defect-oriented testing and defective-part-level prediction," *Design and Test of Computers*, vol. 18, No. 1, pp. 31-41 (2001).
Engelke et al., "Simulating resistive bridging and stuck-at faults," *Proc. Int. Test Conf.*, pp. 1051-1060 (2003).
Ferguson et al., "Test pattern generation for realistic bridge faults in CMOS ICs," *Proc. Int. Test Conf.*, pp. 492-499 (1991).
Grimaila et al., "REDO—random excitation and deterministic observation—first commercial experiment," *Proc. VTS*, pp. 268-274 (1999).
Krishnaswamy et al., "A study of bridging defect probabilities on a Pentium™ 4 CPU," *Proc. Int. Test Conf.*, pp. 688-695 (2001).
Lee et al., "PROBE: a PPSFP simulator for resistive bridging faults," *Proc. VTS*, pp. 105-110 (2000).
Lee et al., "BIFEST: a built-in intermediate fault effect sensing and test generation system for CMOS bridging faults," *ACM Trans. on Design Automation of Electronic Systems*, vol. 4, No. 2, pp. 194-218 (1999).
Ma et al., "A comparison of bridging fault simulation methods," *Proc. Int. Test Conf.*, pp. 587-595 (1999).
Ma et al., "An Experimental Chip to Evaluate Test Techniques Experiment Results," *Proc. Int. Test Conf.*, pp. 663-672 (1995).
Mandava et al., "On detecting bridges causing timing failures," *Proc. ICCD*, pp. 400-406 (1999).
Maxwell et al., "Biased voting: a method for simulating CMOS bridging faults in the presence of variable gate logic thresholds," *Proc. Int. Test Conf.*, pp. 63-72 (1993).
Millman et al., "An accurate bridging fault test pattern generator," *Proc. Int. Test Conf.*, pp. 411-418 (1991).
Pomeranz et al., "On $n$-detection test sequences for synchronous sequential circuits," Proc. VTS, pp. 336-342 (1997).
Pomeranz et al., "On the characterization of hard-to-detect bridging faults," *Proc. DATE*, pp. 1012-1017 (2003).
Pomeranz et al., "Stuck-at tuple-detection: a fault model based on stuck-at faults for improved defect coverage," *Proc. VTS*, pp. 289-294 (1998).
Rajski et al., "Embedded deterministic test for low cost manufacturing test," *Proc. Int. Test Conf.*, pp. 301-310 (2002).
Renovell et al., "CMOS bridging fault modeling," *Proc. VTS*, pp. 392-397 (1994).
Renovell et al., "Detection of defects using fault model oriented test sequences," *Journal of Elec. Testing: Theory and Applications 14*, pp. 13-22 (1999).
Renovell et al., "The concept of resistance interval: a new parametric model for realistic resistive bridging fault," *Proc. VTS*, pp. 184-189 (1995).
Sar-Dessai et al., "Accurate fault modeling and fault simulation of resistive bridges," *Proc. Int'l Symp. on Defect and Fault Tolerance in VLSI Systems*, pp. 102-107 (1998).
Sar-Dessai et al., "Resistive bridge fault modeling, simulation and test generation," *Proc. Int. Test Conf.*, pp. 596-605 (1999).
Sengupta et al., "Defect-based tests: a key enabler for successful migration to structural test," Intel Technology Journal, Q.1 (1999).
Storey et al., "CMOS bridging faults detection," *Proc. Int. Test Conf.*, pp. 842-851 (1990).
Wohl et al., "Efficient Compression and Application of Deterministic Patterns in a Logic BIST Architecture," *40th Design Automation Conference*, pp. 566-575 (2003).

\* cited by examiner

GENERATING TEST PATTERNS HAVING ENHANCED COVERAGE OF UNTARGETED DEFECTS

CROSS-REFERENCE TO RELATED APPLICATIONS

This application is a divisional of U.S. patent application Ser. No. 10/979,496, filed Nov. 1, 2004 now U.S. Pat. No. 7,509,600, which claims the benefit of U.S. Provisional Application No. 60/564,742, filed Apr. 22, 2004, and U.S. Provisional Application No. 60/608,661, filed Sep. 10, 2004, all of which are hereby incorporated by reference.

TECHNICAL FIELD

This invention relates generally to the testing of integrated circuits and, more particularly, to the generation of test data (in the form of test patterns) that can be applied to scan chains within a circuit-under-test.

BACKGROUND

As integrated circuits are produced with greater and greater levels of circuit density, efficient testing schemes that guarantee high fault coverage while minimizing test costs and chip area overhead have become essential. The number of transistors that can be placed on a chip has been doubling roughly every eighteen months, as predicted by Moore's law. The amount of data required to test such massively complex chips has been increasing even more rapidly. In practical terms, for very large integrated circuits, the test cost is approaching (and may even exceed) the design cost.

Many integrated circuits are tested using structured design-for-testability (DFT) techniques, which employ the general concept of making some or all state variables (e.g., memory elements, such as flip-flops and latches) directly controllable and observable. Preferably, a circuit is treated, as far as testing of combinational faults is concerned, as a combinational or a nearly combinational network. The most-often used DFT methodology assumes that during testing all (or almost all) memory elements are connected to form one or more shift registers termed "scan chains."

A circuit that utilizes scan chains for testing typically has two basic modes of operation: a normal mode and a test (or scan) mode. In the normal mode, the memory elements perform their regular functions. In the scan mode, the memory elements become scan cells that are connected to form a number of scan chains. During a typical test cycle, the scan chains are first operated in the scan mode in order to shift a test pattern into the circuit. The circuit is then operated in normal mode for one or more clock cycles in order to capture the circuit's functional response to the test pattern. Finally, the scan chains are operated in the scan mode in order to shift out the circuit's response to the test patterns. The test response can then be compared to a fault-free response to determine if the circuit-under-test (CUT) works properly.

Scan design methodology has gained widespread adoption by virtue of its simple automatic test pattern generation (ATPG) and silicon debugging capabilities. Today, ATPG software tools are so efficient that it is possible to generate test sets (a collection of test patterns) that guarantee almost complete fault coverage for several types of faults, including stuck-at and transition faults. It is also possible to target other faults, such as path delay and bridging faults.

Typically, when a test pattern is generated by an ATPG tool, only a small number of scan cells (e.g., 2-5%) need to be specified in order to detect the targeted faults. The remaining scan cells in the scan chains can then be filled with random binary values. This results in a test pattern comprising a small portion of deterministically specified test values (also referred to as "deterministic test values") and a large portion of randomly specified test values. Thus, although the test pattern is considered to be fully specified, only a small fraction of the pattern comprises test values used explicitly to test the targeted faults.

In general, an ATPG tool relies on effective fault models to produce test patterns that guarantee coverage of a targeted fault. A fault model typically comprises a logic-level abstraction of circuit behavior in the presence of a circuit fault, such as a physical defect. One of the most widely used fault models for generating test patterns is the single stuck-at-line ("SSL" or "stuck-at") fault model. Although the SSL fault model has been used for many years with proven effectiveness and robustness, it is becoming less effective due to continuously shrinking feature sizes and more complex fabrication processes. Further, the smaller feature sizes and more complex processes create a greater potential for physical defects, such as bridging or bridging-type defects. Existing test patterns generated using the SSL fault model, however, do not adequately cover bridging or bridging-type defects. Such defects can comprise, for example, defects that result in bridges between signal nodes of the circuit (having either low or high resistivity) and physical or design defects that create cross-talk effects between signal nodes of the circuit. It has been shown, for example, that certain test sets having greater than 95% SSL fault coverage produce only 33% coverage of node-to-node bridging faults. Accordingly, there is a need for enhanced test-pattern-generation techniques.

SUMMARY

Disclosed below are representative embodiments of methods, apparatus, and systems for generating test patterns. The test patterns can, for example, increase the probability of detecting defects that are not explicitly targeted during ATPG. The disclosed methods, apparatus, and systems should not be construed as limiting in any way. Instead, the present disclosure is directed toward all novel and nonobvious features and aspects of the various disclosed methods, apparatus, systems, and equivalents thereof, alone and in various combinations and subcombinations with one another. The present disclosure is not limited to any specific aspect or feature, or combination thereof, nor do the disclosed methods, apparatus, and systems require that any one or more specific advantages be present or problems be solved.

One exemplary embodiment of the disclosed technology is a method for generating test patterns in an electronic design automation (EDA) environment. In this embodiment, one or more deterministic test values for testing targeted faults (e.g., stuck-at faults or bridging faults) in an integrated circuit design are determined. Additional test values that increase detectability of one or more untargeted defects during testing are also determined. One or more test patterns are created that include at least a portion of the deterministic test values and at least a portion of the additional test values. The method may further include filling a remainder of the test patterns. The act of determining the additional test values may comprise calculating a signal probability profile for one or more respective nodes in the integrated circuit design using a circuit description of the integrated circuit design. In some implementations, one or more of the nodes can be identified from the signal probability profiles as having a 1-probability or a 0-probability below a threshold level, and corresponding test values can be computed that set the identified nodes to a 1 or a 0, respectively. Similarly, in certain implementations, one or more of the nodes can be identified from the signal probability profiles as having a 0/1 transition probability or 1/0 transition probability below a threshold level, and corresponding test values can be computed that respectively create a 0/1 transition or a 1/0 transition at the identified nodes. Generally speaking, the additional test values can set one or more nodes in the integrated circuit design to respective values (or dynamic behaviors) that otherwise have a likelihood of occurring at the one or more nodes that is less than or equal to a predetermined limit. In certain implementations, the act of creating the one or more test patterns is performed so as not to exceed a maximum number of specified values allowed for a respective test pattern. The maximum number of specified values allowed may be dependent on the compression scheme used to compress the one or more test patterns (e.g., an embedded compression scheme). In some implementations, the method further comprises evaluating a quality of the test patterns having the additional test values using a bridge coverage estimate (BCE+) metric. The BCE+ metric can be substantially equal to:

$$\sum_{i=1}^{n} \frac{f_i^{sa0}}{|F|} \cdot \left\{ \sum_{j=1}^{|S|} \frac{1}{|S|} (1 - (1 - p_0^j)^i) \right\} + \sum_{i=1}^{n} \frac{f_i^{sa1}}{|F|} \cdot \left\{ \sum_{j=1}^{|S|} \frac{1}{|S|} (1 - (1 - p_1^j)^i) \right\},$$

where $f_i^{sa0}$ is a number of stuck-at-0 faults detected i times by the test patterns, $f_i^{sa1}$ is a number of stuck-at-1 faults detected i times by the test patterns, |F| is a total number of stuck-at faults in a target fault list F, n is a maximum number of times that a fault can be detected by the test patterns, $p_0^j$ is a 0-probability of signal j, $p_1^j$ is a 1-probalility of signal j, and |S| is a total number of signals considered.

Another exemplary embodiment is a computer-implemented method for generating test patterns used to test an integrated circuit. In this embodiment, a circuit description of the integrated circuit is received. Using the circuit description, respective probabilities that one or more nodes in the integrated circuit will be set to a selected signal value upon application of one or more test patterns are determined. Based at least in part on the probabilities, one or more target nodes from the nodes are selected. One or more test-pattern values that cause the target nodes to be set to the selected signal value are determined. In certain implementations, nodes having a probability of being set to the selected signal value less than a predetermined threshold are selected as the target nodes. Further, for at least one of the selected target nodes, a set of multiple test-pattern values (referred to as a signal probability enhancing (SPE) cube) may be determined. Similarly, for at least one of the selected target nodes, multiple nonidentical sets of test-pattern values (or SPE cubes) may be determined. In some implementations, one or more test patterns comprising deterministically specified test values for testing targeted faults are modified to include at least some of the one or more test-pattern values determined.

In a further exemplary embodiment, another computer-implemented method for generating test patterns used to test an integrated circuit is disclosed. In this embodiment, a circuit description of the integrated circuit is received. Using the circuit description, respective probabilities that one or more nodes in the integrated circuit will have a predetermined behavior during at least two consecutive test cycles upon application of two or more test patterns are determined. Based at least in part on the probabilities, one or more target nodes are selected from the nodes. Test-pattern values are determined that cause the target nodes to have the predetermined behavior. In certain implementations, the nodes with probabilities of having the predetermined behavior less than a predetermined threshold are selected as the target nodes. Further, the predetermined behavior may comprise a selected signal transition. In such cases, for at least one of the selected target nodes, a first set and a second set of test-pattern values can be determined. The first set and the second set will produce the selected signal transition at the selected target node when the first set and the second set are applied consecutively. The predetermined behavior may also comprise static behavior. In these cases, for at least one of the selected target nodes, a first set and a second set of test-pattern values can be determined. The first set and the second set will produce the static behavior at the selected target node when the first set and the second set are applied consecutively. In some implementations, two or more test patterns comprising deterministically specified test values for testing targeted faults are modified to include at least some of the test-pattern values determined.

In another exemplary embodiment, another method for generating test patterns in an EDA environment is disclosed. In this embodiment, a first set of one or more test values for testing an integrated circuit design is determined. The first set of test values is configured to enhance a probability that a node associated with an untargeted fault will have a desired value during testing. A test pattern to be applied to the integrated circuit design during testing and which comprises the first set of test values is generated. The test pattern may further comprise a second set of one or more test values that is configured to test one or more targeted faults using fault models associated with targeted defects. For example, the targeted faults may comprise bridging defects extracted from physical layout data. The act of determining the first set of one or more test values may comprise calculating a probability that the node will have the desired value during application of a previously determined set of test patterns. Further, the act of generating the test pattern may be performed so as not to exceed a maximum number of specified values allowed. The maximum number of specified values allowed is typically dependent on a compression scheme used to compress the test pattern.

In another exemplary embodiment, yet another method for generating test patterns in an EDA environment is disclosed. In this embodiment, a first sequence of one or more test values for testing an integrated circuit design is determined. The first sequence of test values is configured to enhance a probability that a node associated with an untargeted fault will have a desired behavior during two or more consecutive test periods. Two or more test patterns to be consecutively applied to the integrated circuit design during testing and which comprise the first sequence of test values are generated. The two or more test patterns may further comprise one or more test values configured to test one or more targeted faults using fault models associated with targeted defects (e.g., bridging defects extracted from physical layout data). The act of determining the first sequence of test values may comprise calculating a probability that the node will have the desired value or desired transition over two consecutive test periods during application of a previously determined set of test patterns. Further, the act of generating the two or more test patterns can be performed so as not to exceed a maximum number of specified values allowed for a respective test pattern.

Any of the disclosed methods may be performed by a computer program, such as an EDA software tool, comprising computer-executable instructions stored on one or more computer-readable media. Similarly, any of the test patterns generated by the disclosed embodiments can be stored on one or more computer-readable media.

The foregoing and additional features and advantages of the disclosed embodiments will become more apparent from the following detailed description, which proceeds with reference to the following drawings.

DETAILED DESCRIPTION

General Considerations

Figure 1A:
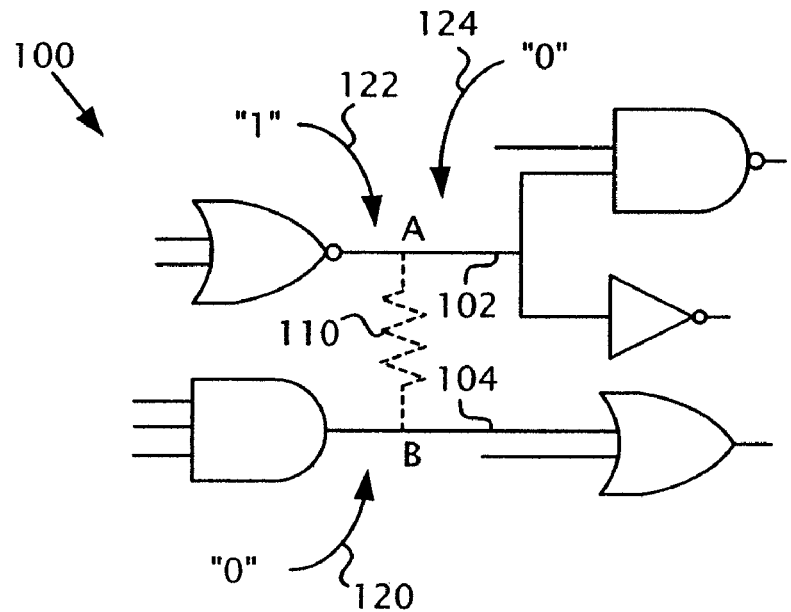
FIGS. 1(A)-1(C) are block diagrams illustrating various possible bridging and bridging-type defects and the fault behavior they provoke.

As used herein and in the claims, the singular forms "a", "an", and "the" include the plural forms unless the context clearly dictates otherwise. Additionally, the term "includes" means "comprises."

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "generate" and "determine" to describe the disclosed methods. These terms are high-level abstractions of the actual operations that are performed. The actual operations that correspond to these terms will vary depending on the particular implementation and are readily discernible by one of ordinary skill in the art.

The disclosed embodiments can be used to generate test patterns for testing a wide variety of circuits (e.g., application-specific integrated circuits (ASICs) (including mixed-signal ASICs), systems-on-a-chip (SoCs), or programmable logic devices (PLDs), such as field programmable gate arrays (FPGAs)). Any of the methods or techniques described herein can be performed using software that comprises computer-executable instructions stored on one or more computer-readable media. Such software can comprise, for example, an electronic-design-automation (EDA) software tool, such as an automatic test pattern generation (ATPG) tool. Any such software can be executed on a single computer or on a networked computer system (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail.

One or more test patterns that are produced by any of the disclosed methods, apparatus, and systems can be stored on one or more computer-readable media and are considered to be within the scope of this disclosure. Computer-readable media storing such test patterns may be accessed and used by a single computer, networked computer (such as those described above), or dedicated testing system (e.g., automatic testing equipment (ATE))

Any of the disclosed methods can be used to generate test patterns for physically existing circuit designs or for representations of circuit designs stored on one or more computer-readable media. For example, the disclosed methods typically use circuit design information (e.g., a netlist, HDL file (such as a Verilog or VHDL file), or GDSII file) stored on computer-readable media during test pattern generation.

Certain aspects of the disclosed technology involve storing or retrieving data from one or more lists. As used herein, the term "list" refers to a collection or arrangement of data that is usable by a computer. A list may be, for example, a data structure or combination of data structures (such as a queue, stack, array, linked list, heap, or tree) that organizes data for better processing efficiency, or any other structured logical or physical representation of data in a computer system or computer-readable media (such as a table used in a relational database). Moreover, any of the lists discussed herein may be persistent (that is, the list may be stored in computer-readable media such that it is available beyond the execution of the application creating and using the list) or non-persistent (that is, the list may be only temporarily stored in computer-readable media such that it is cleared when the application creating and using the list is closed or when the list is no longer needed by the application).

For illustrative purposes only, aspects of the disclosed technology are discussed in the context of improving fault coverage of bridging defects, and, in particular, bridging defects that cause static failures. The techniques and principles described herein, however, can be more generally applied to other types of defects, such as those that cause dynamic failures (e.g., a resistive bridge with comparatively high resistance) or those that produce undesirable capacitive couplings between circuit nodes resulting in cross-talk failures. Thus, the disclosed technology can be widely applied to improve the coverage for a variety of defects, including bridging and bridging-type defects.

Detecting Bridging Defects in General

One possible way to improve bridging fault coverage is to adopt advanced bridging fault models and explicitly target bridging defects for a particular circuit design with test generation and simulation. Typically, bridging defects in the circuit design can only be identified and targeted using physical layout information for the circuit design (e.g., using a GDSII or Oasis file). This type of technique is generally referred to herein as the "defect based test" (DBT) approach. Although this approach guarantees coverage of the extracted bridging defects, it also has a number of limitations. First, test pattern generation may have to be postponed until the physical design is available, which may delay the tape-out of the design. Next, the number of extracted bridging faults could be one or two orders of magnitude higher than the number of SSL faults, which makes the extraction of the bridging fault list from the layout information very time consuming. In addition, the complexity of the bridging fault models used and the large number of possible bridging faults can make test pattern generation and simulation of the test patterns in the circuit impractical for modern multi-million gate designs. For this reason, this approach is typically applied only to a set of selected bridging defects that correspondingly have the largest critical area of the circuit design. Consequently, only the most likely defects in the design are tested. Another way of further reducing the large number of potential bridging faults that could be explicitly tested is to target only those bridging faults that are determined to be rarely provoked during application of the regular stuck-at test patterns. The detection of such "hard-to-detect" bridging faults, however, may not guarantee detection of all bridging defects, as many defects will not be extracted and explicitly targeted. Moreover, the number of hard-to-detect bridging faults can still be undesirably high, resulting in a large number of test patterns beyond those used to detect stuck-at faults.

Another technique for testing bridging faults relies on the fact that test patterns generated for targeted faults typically have some ability to fortuitously detect bridging defects. A typical test set detects a targeted fault multiple times. Thus, for instance, for test patterns designed to detect stuck-at faults, every time a stuck-at fault is detected and an aggressor signal in a pair of bridged signal lines is known to have an associated bridging-fault activation value, a corresponding bridging fault is detected as well. For this reason, one technique used to increase bridging fault coverage involves targeting stuck-at faults multiple times using deterministic test values under the assumption that the untargeted bridging faults will occasionally be provoked by the other, randomly specified test-pattern values in the test patterns. By using such a technique, which is referred to herein as the "multiple-detect" or "n-detect" technique, the probability of detecting bridging faults is increased without having to explicitly target the defects and extract them from physical layout information. The effectiveness of the multiple-detect technique can be impaired, however, if the aggressor nodes that are associated with the bridging faults have poor signal probabilities (e.g., if the aggressor nodes have a low probability of being set to the particular value or of having the particular behavior that activates the respective bridging fault during testing).

Fault Models for Detecting Defects

Many fault models have been proposed to model the behavior of defects and the static and/or dynamic failures that may result from such defects. For example, static bridging fault models include: wired models, dominant models, voting models, biased-voting models, and the like. Dynamic bridging fault models typically comprise variants of the transition fault model.

For illustrative purposes only, the disclosed technology is often discussed in connection with a four-way bridging fault model used to model static failures caused by a bridging defect. This particular implementation, however, should not be construed as limiting, as the disclosed technology can be adapted for use with other fault models for detecting a variety of defects.

In the four-way bridging fault model, a static bridging defect between two nodes (e.g., node A and node B) may be detected as one of four bridging faults resulting from one of the nodes dominating the other. The four bridging faults can be denoted as follows: {A dom 0}, {B dom 0}, {A dom 1}, and {B dom 1}, where {A dom 0} means that node A behaves like a stuck-at-0 fault when node B is 0 (in this case, node A is referred to as the "victim" node, and node B is referred to as the "aggressor" node). The other three bridging faults are derived in a similar manner.

FIG. 1(A) is a block diagram of a circuit portion 100 illustrating an exemplary bridge that produces the static bridging fault {A dom 0}. In particular, FIG. 1(A) schematically shows a signal wire 102 (on which node A is located) making direct contact with signal wire 104 (on which node B is located) through a bridging defect 110 having relatively low resistance. Such a defect may result, for example, from a lithographic error during pattern transfer or some other fabrication error. Assume that the bridging defect 110 causes the signal wire 104 to dominate the signal wire 102. Thus, if the value at node B is low (shown at 120) while the value at node A is supposed to be high (shown at 122), node A will remain low (shown at 124). Thus, node A behaves like a stuck-at-0 fault when node B is 0.

The four-way bridging model can be modified to model other types of faults caused by bridging and bridging-type defects, such as dynamic faults. Like static bridging faults, dynamic bridging faults also involve a dominant node affecting the behavior of a victim node. In general, a dynamic bridging fault exists when a transition at the aggressor node produces a failing value at the victim node.

Figure 1B:
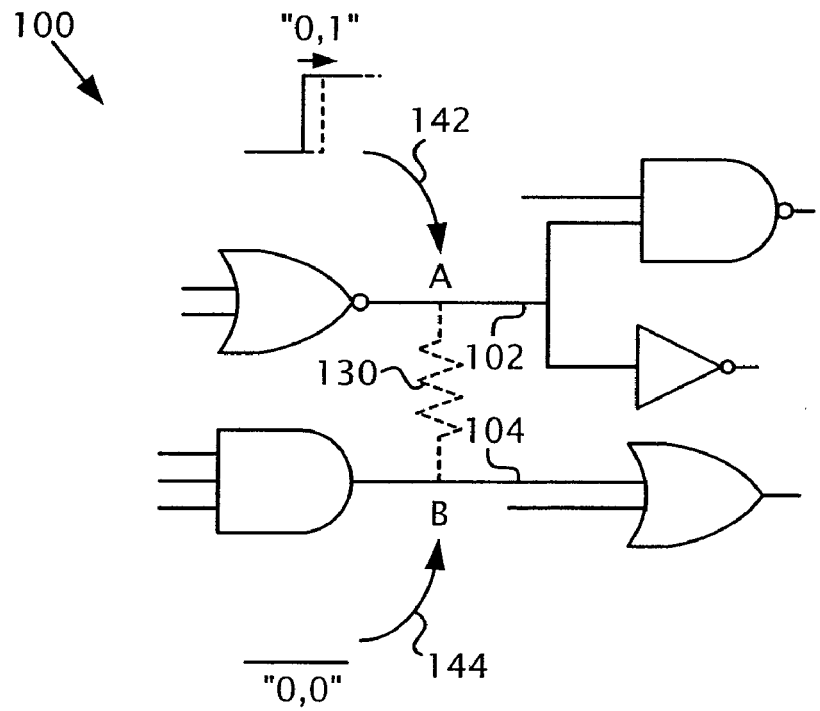

One type of dynamic bridging fault that can be modeled using a modified four-way bridging model is caused by a resistive bridge. In FIG. 1(B), for example, bridging defect 130 has a high enough resistance not to override the signal on signal wire 102, but instead produces a resistance on the signal wire 102 that delays propagation of the signal on the wire. As a result of the resistive bridge 130, the rise time of a low-to-high transition at node A is delayed (shown by 142, where the expected waveform is shown as a solid line and the actual waveform is shown as a dotted line) when the signal wire 104 stays low (shown by 144). Consequently, node A behaves like a slow-to-rise fault when node B is 0, which can be expressed as: {A dom STR}.

Figure 1C:
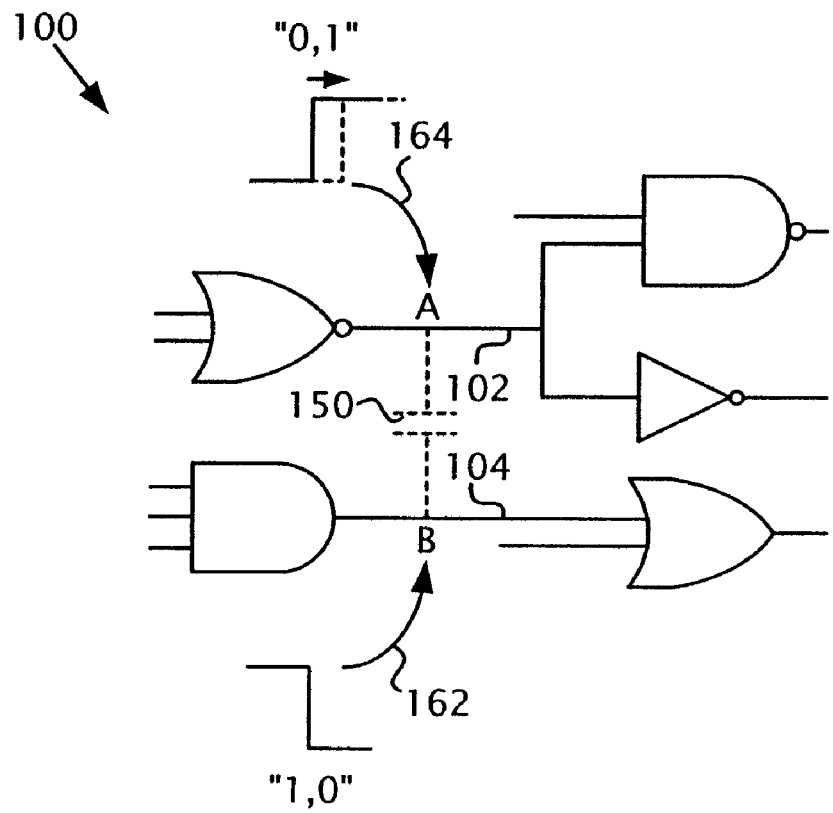

Another type of dynamic fault that can be modeled is produced by cross-talk between two signal wires (e.g., resulting from the capacitive coupling of the two wires to one another). This type of fault may be caused by a physical defect (e.g., a physical irregularity) or a design defect (e.g., a circuit designer's failure to account for certain electromagnetic properties of the circuit), and is generally considered one of the possible defects for which the disclosed technology can be used. An example of two circuit nodes having undesirable cross-talk effects is illustrated in FIG. 1(C). In FIG. 1(C), a high-to-low transition at node B (shown by 162) produces a delay in the low-to-high transition (shown by 164, where the expected waveform is shown as a solid line and the actual waveform is shown as a dotted line) that was supposed to occur simultaneously at node A. In this case, defect 150 creates a capacitive coupling between the signal wires 102, 104 and causes a cross-talk fault to occur.

Signal Probabilities

So-called "hard-to-detect" faults are faults that are typically activated by relatively few test patterns. Consequently, such faults have a lower chance of being fortuitously detected during application of conventional test patterns. Whether or not a particular fault is a hard-to-detect fault can be determined by evaluating the probability that a node associated with the fault (the aggressor node) will have the particular value or dynamic behavior that activates the fault during application of a set of test patterns.

For example, consider the static bridging fault illustrated in FIG. 1(A). For a given signal line S, the probability of S to be a "1" or a "0" during application of a given test set is defined as S's "1-probability" or "0-probability," respectively. According to one exemplary embodiment, the 1-probability and 0-probability for a signal line S when a given test set is applied is obtained by performing logic simulation of the test set. Alternatively, because input values in a typical test set have substantially the same probability of being a "1" or "0," signal probability can be estimated using static analysis. If the 1-probability and the 0-probability of S are substantially equal to 0.5 (that is, S has a substantially the same likelihood of being a "1" or a "0"), signal line S is said to be "balanced;" otherwise, signal line S is referred to as a "biased signal."

Consider, for example, a bridging defect between nodes A and B that creates a bridging fault {A dom 0}. Suppose that nodes A and B are un-correlated and that the number of times stuck-at-0 behavior at node A is detected is held at a constant value. As the 0-probability value of the aggressor B decreases, it becomes harder to detect the bridging fault {A dom 0} because the number of times stuck-at-0 behavior is observed at node A while node B has the proper activation value also decreases. If the signal-probability value (here, the 0-probability value) of B is lower than some threshold value (sometimes denoted SP_th), the node can be considered a low-probability node and the corresponding bridging fault (here, {A dom 0}) can be considered to be a hard-to-detect bridging fault.

The threshold value SP_th can vary from implementation to implementation, but in one exemplary implementation is set as 0.1. In the experiments discussed below, for instance, the threshold value SP_th for the 0-probability and 1-probability was set at 0.1. Moreover, multiple threshold values may be used (e.g., different thresholds for the 0- and 1-probability values, different thresholds for different types of bridging faults, or different thresholds for different regions of the design being analyzed). Further, the threshold value may correspond to whether the signal-probability value is above a certain threshold (e.g., 0.9).

A similar analysis can be applied to dynamic faults as well. In these cases, the probability to be considered will comprise the probability of the aggressor node having a particular behavior over multiple test cycles (e.g., the probability of the node having a certain transition during testing, such as a rising or falling transition). For example, consider the cross-talk fault illustrated in FIG. 1(C). As discussed above, if there is a rising transition at victim node A and a falling transition at aggressor node B, the transition at node A will be delayed, and a slow-to-rise transition fault will be activated. Thus, if the falling transition probability value at node B is lower than the threshold value (SP_th), the node can be considered a low-probability node and the dynamic cross-talk fault can be considered a hard-to-detect fault.

Bridge Coverage Estimates

In the context of detecting bridging faults using conventional SSL fault models, the probability of fortuitously detecting a bridging fault depends on the number of times the corresponding stuck-at fault (or transition fault) is detected and the 1- or 0-probability (or transition probability) at the associated aggressor node. In this section, an exemplary technique for estimating coverage of bridging faults using the multiple-detect technique is described.

A metric known as the "bridge coverage estimate" (BCE) has been used to measure the quality of test sets generated by conventional multiple-detect techniques using test patterns for detecting SSL faults. The BCE has been shown to have good agreement with the actual defect-level coverage based on experimental results from actual manufactured chips.

Given a test set T and a target fault list F, the BCE is calculated as follows:

$$BCE = \sum_{i=1}^{n} \frac{f_i}{|F|} \cdot (1 - 2^{-i}), \quad (1)$$

where $f_i$ is the number of stuck-at faults detected i times by T, |F| is the total number of stuck-at faults in the target fault list F, and n is the maximum number of times that a fault can be detected by T.

Because fault simulation tools do not typically keep track of fault detections beyond a certain number, n may be reduced to the maximum number of detections that the fault simulator records. For example, according to the multiple-detect technique, once a fault is detected a certain number of times, additional detections are no longer recorded and the fault is removed from the target fault list. Any error that is induced by this treatment can be reduced by increasing n.

One of the underlying assumptions of the BCE is that the aggressor node for any given bridging fault has a 50% probability of having an activation value. In reality, however, aggressor nodes often do not satisfy this assumption. Moreover, as shown below with respect to FIG. 2, the existence of biased aggressor nodes in a circuit design can have a substantial impact on the detection probability of bridging faults. Consider, for example, a bridging fault {A dom 0} between nodes A and B. For a given test set, assuming that the 0-probability value of node B is p and that the stuck-at-0 fault at node A (denoted "A sa0") is detected by n different test patterns, the probability that this bridging fault will be detected by the test set will be $1-(1-p)^n$.

Figure 2:
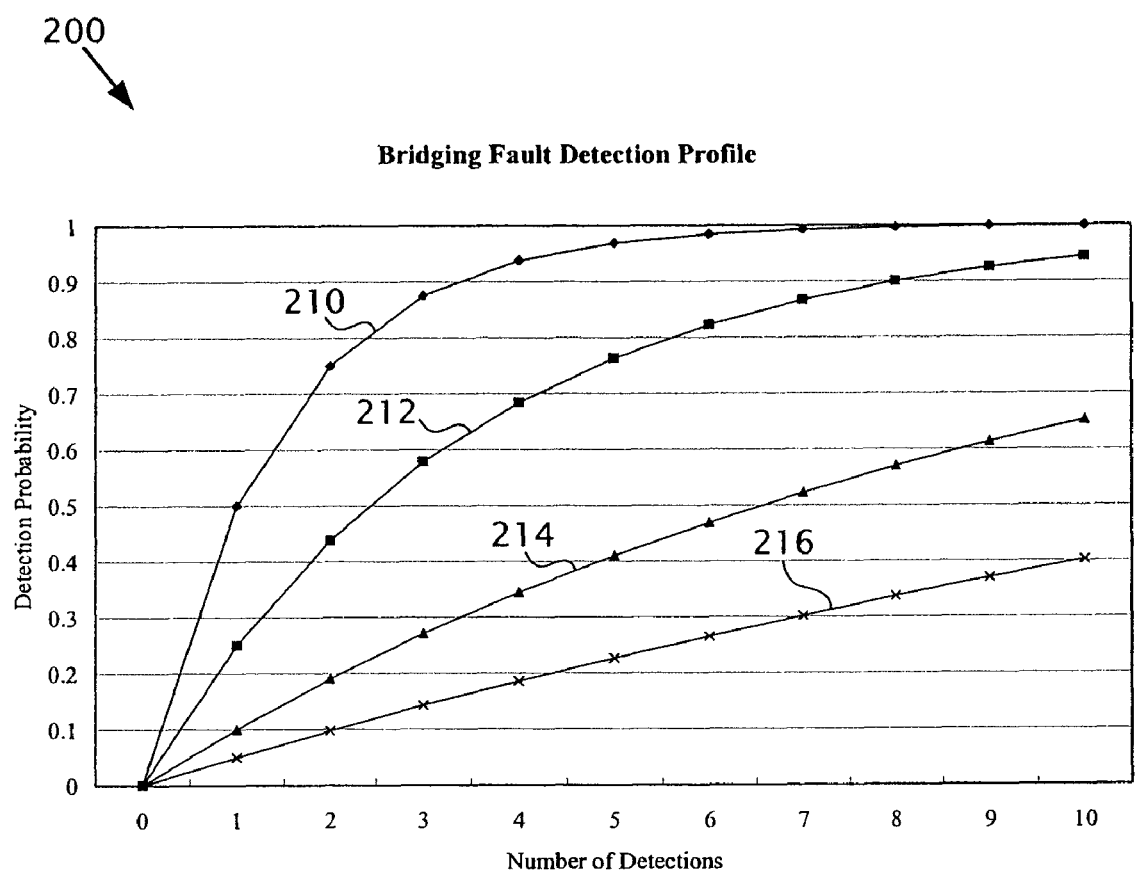
FIG. 2 is a graph illustrating the effect that signal probability at an aggressor node of a bridging defect producing static faults has on the detectability of the defect.

FIG. 2 is a graph 200 illustrating the probability of detecting the bridging fault {A dom 0} for various 0-probabilities at the associated aggressor node. In the graph 200, the x axis represents the number of times the stuck-at-0 fault is detected at node A, whereas the y axis represents the detection probability of the associated, but untargeted, bridging fault. Four curves 210, 212, 214, and 216 represent aggressor nodes having a 0-probability value of 0.5, 0.25, 0.1, and 0.05, respectively.

It can be observed from FIG. 2 that the effectiveness of the multiple-detect technique quickly diminishes with decreasing signal probability values. For example, if the 0-probability value of the aggressor node is 0.5 (shown by curve 210), a single detection of the corresponding stuck-at fault will provide a 0.5 probability that the bridging fault will be detected. However, if the 0-probability value of the aggressor is 0.05 (shown by curve 216), the detection probability of the bridging fault only reaches 0.4, even if the corresponding stuck-at fault is detected ten times.

In general, FIG. 2 illustrates that to achieve a higher detection probability for a bridging fault, far fewer detections of the related stuck-at fault are required if the aggressor of the bridging fault has a more balanced signal probability (that is, a 0-probability or 1-probability closer to 0.5). Thus, for a given number of fault detections on the victim signal lines, the detection probability of the related bridging faults can be effectively increased by enhancing the signal probability of aggressor lines. Signal probability enhancement not only improves the bridging defect coverage, but can reduce the length of the test set required to achieve a given level of defect coverage.

To overcome the inaccuracy of BCE caused by the balanced-signal assumption, an exemplary improved bridge coverage estimate, denoted as "BCE$^+$," is described below. In general, the exemplary BCE$^+$ combines multiple detection profiles of SSL faults and signal probability profiles of a design for a given set of tests.

Given a test set T, a set of signal nodes S and a target fault list F, the BCE$^+$ can be calculated as follows:

$$BCE^+ = \sum_{i=1}^{n} \frac{f_i^{sa0}}{|F|} \cdot \left\{ \sum_{j=1}^{|S|} \frac{1}{|S|} (1 - (1 - p_0^j)^i) \right\} + \sum_{i=1}^{n} \frac{f_i^{sa1}}{|F|} \cdot \left\{ \sum_{j=1}^{|S|} \frac{1}{|S|} (1 - (1 - p_1^j)^i) \right\}, \quad (2)$$

where $f_i^{sa0}$ is the number of stuck-at-0 faults detected i times by T, $f_i^{sa1}$ is the number of stuck-at-1 faults detected i times by T, |F| is the total number of stuck-at faults in the target fault list F, n is the maximum number of detections that a fault can be detected by T, $p_0^j$ is the 0-probability of signal j, $p_1^j$ is the 1-probalility of signal j, and |S| is the total number of signals considered.

For a given stuck-at-0 fault f detected i times by T (and assuming that potential bridging faults can occur between any other signal node in S and the node of f), the detection probability of the bridging fault can be calculated as the sum shown in the first brackets of Equation (2). The overall detection probability of the bridging faults can be estimated by averaging the detection probability of all potential bridging faults. It can be seen from Equation (2) that BCE is a special case of BCE$^+$ where $p_0^j = p_1^j = 0.5$ for all signals.

As noted, the maximum number of times a fault can be detected (n) is often limited during fault simulation. The value of n should desirably be large enough, however, to produce only a small BCE error. For example, n=10 can make the BCE error less than 0.1%. For BCE$^+$, however, the existence of strongly biased signals usually requires n to be comparatively larger. Given a signal $s_j$ with a 0-probability $p_0^j = 0.01$, for example, the value of $(1 - p_0^j)^n$ is equal to 0.904 when n=10. This value is reduced to 0.366 for n=100. Thus, in order to achieve higher accuracy for BCE$^+$, the value of n can be increased. In the experiments discussed below, for example, n was set at 250.

To reduce the computational overhead of calculating BCE$^+$, only a selected subset of possible bridging faults may be considered. For example, in the experiments discussed below, only bridging faults involving stems as aggressors were considered. If the computation overhead needs to be further reduced, the signals can be grouped according to their signal probabilities and these signal groups used to calculate BCE$^+$ instead of the individual signal nodes.

Another improved bridge coverage estimate similar to BCE$^+$ can be used for resistive bridging faults or cross-talk effects. This estimate, termed the cross-talk fault coverage estimate ("CCE$^+$") includes multiple-detect profiles of transition faults and signal probability profiles. Given an at-speed test set T, a set of signal nodes S, and a target transition fault list F, the CCE$^+$ can be calculated as follows:

$$CCE^+ = \sum_{i=1}^{n} \frac{f_i^{STR}}{|F|} \cdot \left\{ \sum_{j=1}^{|S|} \frac{1}{|S|} (1 - (1 - p_{1 \to 0}^j)^i) \right\} + \sum_{i=1}^{n} \frac{f_i^{STF}}{|F|} \cdot \left\{ \sum_{j=1}^{|S|} \frac{1}{|S|} (1 - (1 - p_{0 \to 1}^j)^i) \right\}, \quad (3)$$

where $f_i^{STR}$ is the number of slow-to-rise faults detected i times by T, $f_i^{STF}$ is the number of slow-to-fall faults detected i times by T, |F| is the total number of transition faults in the target fault list F, n is the maximum number of detections that a transition fault can be detected by T, $p_{1 \to 0}^j$ is the probability of a falling transition of signal j, $p_{0 \to 1}^j$ is the probability of a rising transition of signal j, and |S| is the total number of signals considered.

Exemplary Embodiments of Enhanced Test Pattern Generation

In this section, exemplary embodiments of a method for generating test patterns that have an improved ability to detect untargeted defects are disclosed. The disclosed embodiments are described in connection with detecting untargeted bridging defects (bridges having low resistance), but this particular application should not be construed as limiting in any way. Instead, the disclosed technology is more generally applicable to a wide range of defects involving the interaction of multiple nets (e.g., resistive bridges and defects causing cross-talk effects).

Automatic Test Pattern Generation in General

Automatic test pattern generation (ATPG) is typically performed in the following manner. In generating a test pattern to be included in a test set, one or more faults from a list of targeted faults are selected and a test pattern configured to detect the targeted faults is obtained. The deterministic test values in the test pattern comprise values explicitly generated to provoke the targeted faults. Typically, the deterministic test values comprise only a small portion of the test values in a test pattern. In some cases, for example, only 1% to 5% of the values in a test pattern are deterministic values for testing targeted faults. The remaining, unspecified values are typically filled with randomly selected values used to fully specify the test pattern for fault simulation and testing. In some cases, instead of random values, constant "0"s or "1"s are chosen. In still other cases, values that minimize power dissipation are used. Fault simulation is then performed to determine which of the faults are detected and can be dropped from further consideration (e.g., removed from the list of targeted faults). This procedure is iterated until all faults have been targeted and detected.

In test environments that use encoding or compression to reduce test data volume (such as embedded deterministic test), the unspecified values in a test pattern are pseudo randomly filled by a decompressor during test stimuli loading. The fully specified pattern resulting from decompression can be simulated during ATPG in order to determine what faults are detected by the test pattern and can be dropped from the list of targeted faults.

Although some faults may be detected fortuitously by the random fill of unknown values, the effectiveness of random filling quickly saturates as pattern count increases. This is especially true for designs having many random pattern resistant faults.

Signal Probability Enhancing Cubes

The unspecified values in a partially specified pattern can be exploited in order to increase detectability of untargeted defects. In particular, one or more additional test values can be determined that are configured to enhance the probability that an aggressor node of an untargeted fault will have an activation value or behavior during application of one or more test patterns. As used herein, a set of test values that enhances the signal probability of a potential aggressor node is termed a "signal probability enhancing cube" or "SPE cube." An SPE cube for a node comprises a minimally specified input vector (that is, a comparatively small set of one or more test-pattern values) that sets the node to a specific logic value. Further, multiple SPE cubes may be applied in consecutive test cycles in order to make the node have a specific behavior (e.g., a certain transition or state sequence).

Figure 3:
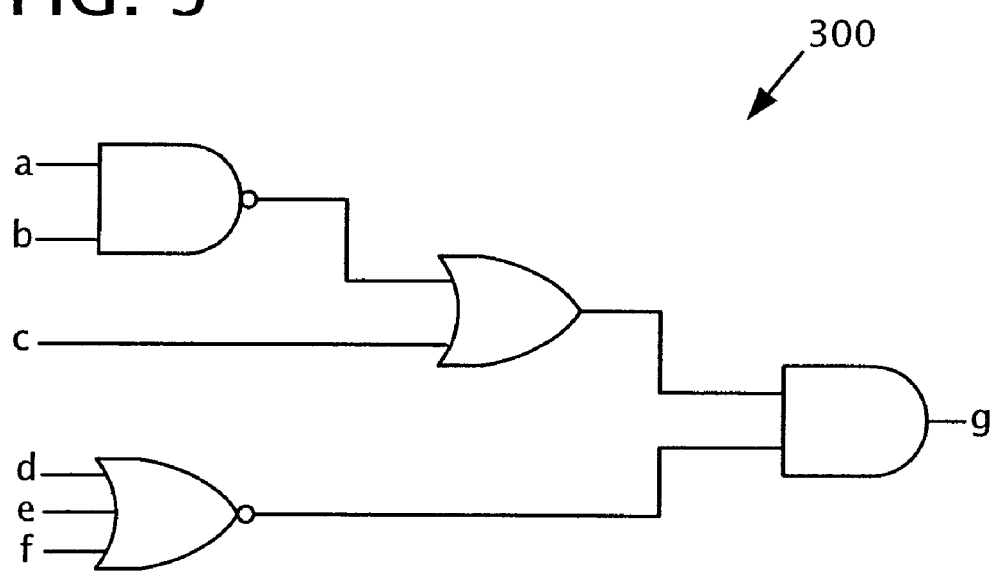
FIG. 3 is a block diagram of a circuit portion illustrating a node having a low 1-probability.

According to one exemplary embodiment, the nodes selected to be enhanced with SPE cubes have strongly biased signal probabilities when the unspecified values in a test pattern are filled with non-deterministic values. For example, for defects causing static failures, the nodes may be nodes having a 0- or a 1-probability less than a threshold value. Consider, for example, the block diagram in FIG. 3 showing an exemplary portion 300 of a circuit having a node (node g) that has a strongly biased signal probability, and thus can be targeted to be enhanced with an SPE cube. If the inputs a, b, c, d, e, and f are randomly specified, node g is found to have a low 1-probability value (in this case, 5/64). The input vector <XX1000> (which denotes the values input on inputs a, b, c, d, e, and f, respectively, and which denotes an unspecified or "don't care" value as an "X") can be used to set node g to 1 and may be used as an SPE cube for node g. The input vector <11X000> is another possible SPE cube for node g.

SPE cubes for a node can be determined by performing backward implications from the node with the node value set to the desired value (e.g., the low-probability value). In order to reduce the impact on the randomness of the generated test patterns, certain embodiments of the disclosed technology generate and store several different SPE cubes for each node, which can then be applied in rotation. For example, in the experiments discussed in this disclosure, up to three SPE cubes were generated and stored for each target node. In other embodiments of the disclosed technology, however, other numbers are SPE cubes are used.

Enhanced Automatic Test Pattern Generation

Figure 4:
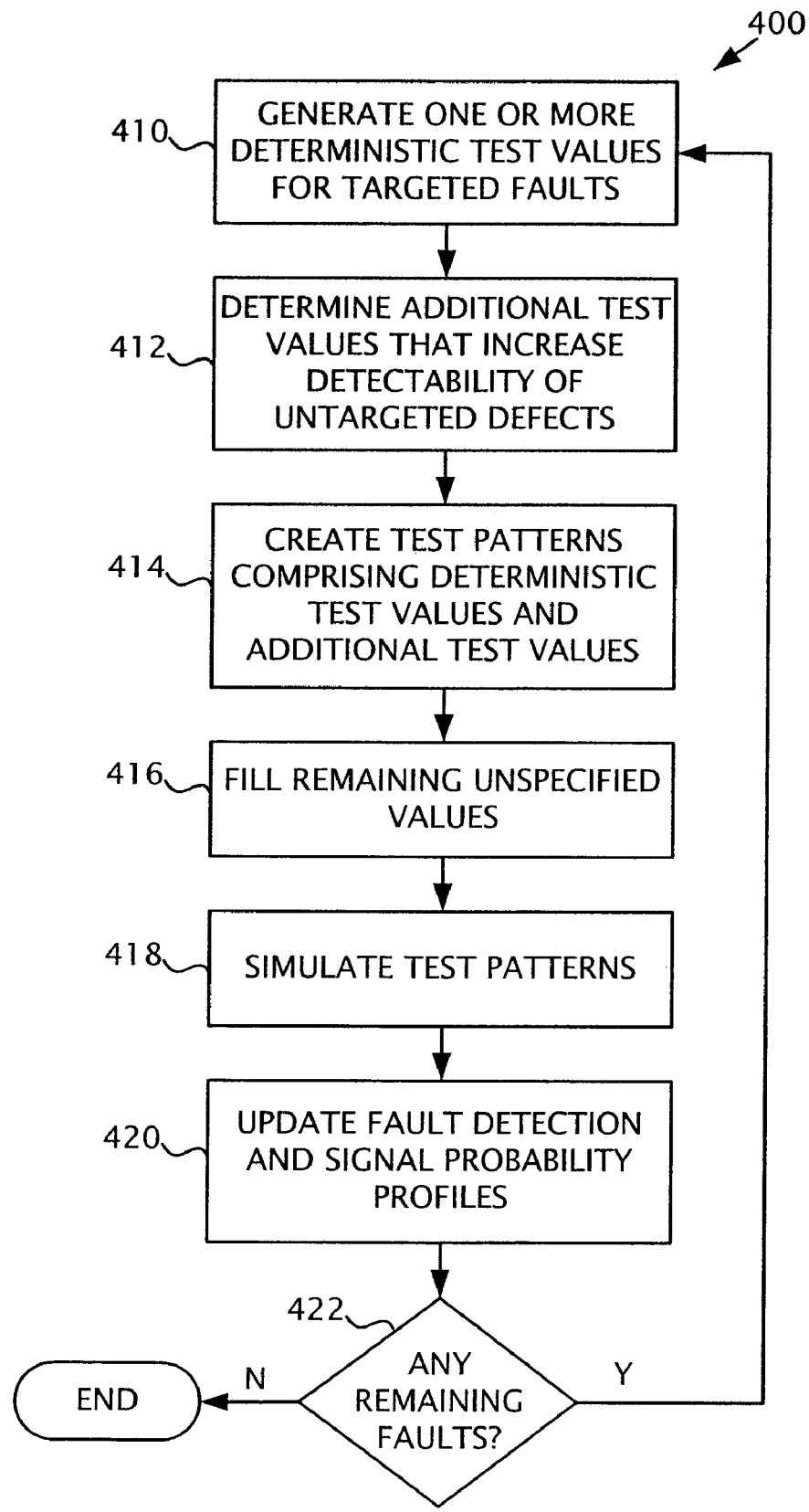
FIG. 4 is a flowchart of a first exemplary method for generating test patterns according to the disclosed technology.

FIG. 4 is a flowchart 400 illustrating an exemplary embodiment of a general method for performing enhanced ATPG. A more specific embodiment of the technique is discussed below with respect to FIG. 5.

At process block 410, one or more test values for testing targeted faults are generated. In this embodiment, the test values comprise deterministic test values specifically configured to detect one or more targeted faults (e.g., SSL faults, transition faults, bridging faults, and the like). The one or more test values might be generated, for example, in the form of partially specified test patterns. Further, in one particular implementation, the targeted faults include bridging faults that were extracted from physical layout information of the circuit design (e.g., using a defect-based test (DBT) procedure).

At process block 412, additional test-pattern values are determined that increase the detectability of one or more untargeted defects during testing. For example, SPE cubes for setting a selected node to a particular value or for creating a particular behavior at the selected node can be generated. As noted above, the SPE cubes can be generated through backward implication.

In one exemplary embodiment, the nodes that are selected to be controlled by the one or more additional test-pattern values comprise nodes that have a low probability of having a desired value during testing (e.g., a low probability of having a 0 or 1) or nodes that have a low probability of having a desired behavior over multiple test cycles (e.g., a low probability of having a 1/0 or a 0/1 transition, or a low probability of having static behavior over multiple test cycles). As explained above, such low probability signal behavior makes the detection of certain untargeted defects remote. Thus, it is desirable to increase the frequency with which the nodes have such values or behavior in order to increase the overall ability of test patterns to detect untargeted faults. Accordingly, in one exemplary embodiment, the nodes are selected based on their static or dynamic signal behavior and are not explicitly known to be related to any of the targeted faults. For purposes of this discussion, the nodes selected to be controlled by the one or more additional test pattern values are referred to herein as "SPE targets."

To select the SPE targets in a circuit design, a variety of methods can be used. In one exemplary embodiment, the SPE targets are identified using a signal probability profile determined for one or more nodes in a circuit design (referred to herein as "potential signal probability enhancement targets" or "potential SPE targets"). The signal probability profiles can comprise a variety of information concerning a node's static and/or dynamic behavior. For example, the signal probability profile may comprise one or more of the following: the probability that the node will have a particular value during testing (e.g., 1 or 0), the probability that the node will have a particular transition over consecutive test cycles (e.g., a rising transition (0/1) or a falling transition (1/0)), and the probability that the node will have a particular static behavior over consecutive test cycles (e.g., 0/0 or 1/1). These specific types of behavior, however, should not be construed as limiting, as the information in the signal probability profile may measure the probability of other types of behavior (e.g., different state sequences over any period of time). In general, the type of signal behavior measured in the signal probability profile will depend on the type of defect (and associated fault model) whose detectability is desirably enhanced.

In one embodiment, the signal probabilities can be computed from logic simulations (e.g., using test patterns or groups of the test patterns that were previously generated). Alternatively, in one particular implementation for increasing the likelihood of detecting untargeted static faults, the 1- and 0-probabilities for the potential SPE targets are found using a netlist of the circuit description under the assumption that the 1-probability or 0-probability of all circuit inputs is 0.5. Because it may be too time consuming to keep track of the signal probabilities for all nodes and test patterns in the design, a subset of all nodes in the circuit design may be selected as the potential SPE targets. For example, in one particular implementation, only the signal probabilities of stems in fanout-free regions or subsets of fanout-free regions are considered.

Using the signal probability profiles determined for the potential SPE targets, specific nodes can be selected for SPE enhancement. For example, according to one implementation, if the probability of the SPE target having a certain value or behavior is below or above a certain threshold value (e.g., 0.1 or 0.9, respectively), it is selected as an SPE target. In some implementations, SPE targets can be further prioritized based on the values of the probabilities.

The character of the additional values that are determined at process block 412 will depend on the defect whose detectability is desirably enhanced and the fault effect it produces. For example, for static bridging faults, single SPE cubes can be used to set the potential aggressor nodes to the correct activation value during a single clock cycle, whereas for resistive bridging faults or cross-talk effects, multiple SPE cubes can be used during consecutive test cycles (e.g., to produce the opposite transition at the potential aggressor node in order to activate a cross-talk-effect fault). The types of SPE cubes generated during process block 412 may further depend, for example, on the type of circuit design being tested (a high-speed, timing-critical design) or on a user's specifications.

At process block 414, one or more test patterns are created (or generated) that comprise at least a portion of the deterministic test values from process block 410 and at least a portion of the additional test values from process block 412 (e.g., one or more of the SPE cubes). For example, in one exemplary embodiment, partially specified test patterns are generated at process block 410 using conventional ATPG techniques, and at process block 414 all non-conflicting SPE cubes are applied to the patterns. Thus, two sets of test values (one comprising the deterministic test values for targeted faults, the other comprising test values for increasing the detectability of untargeted defects) are merged into a single pattern. Typically, SPE cubes for enhancing the detectability of untargeted defects producing static faults are merged with deterministic test values for static faults (e.g., SSL faults), whereas SPE cubes for enhancing the detectability of untargeted defects producing dynamic faults are merged with deterministic test values for dynamic faults (e.g., transition faults). In one particular implementation, SPE targets having the lowest (or highest) probabilities for the signal behavior being considered are given priority. As discussed more fully below, the number of test values that may be included in a particular test pattern may further depend in part on whether any encoding capacity remains for the test pattern.

At process block 416, any remaining unspecified values in the test patterns are filled. The remaining unspecified values can be filled in a variety of ways. For instance, one typical way to fill the unspecified values is with random values. In test environments like EDT, for example, the remaining unspecified values are pseudo randomly filled by a decompressor. The remaining unspecified values can also be used to help reduce the impact of unknown values in test responses on compaction ratios. Further, if power dissipation minimization is considered, constant "0"s, "1"s, or a combination thereof that helps minimize the number of switches can be used. The resulting test patterns produce an improved signal probability profile, and thus increase the probability of detecting the untargeted bridging defects.

At process block 418, the resulting test patterns are simulated. At process block 420, the fault detection profile and signal probability profiles are updated (e.g., using the logic simulation results). In one implementation, using single detection ATPG, all faults detected by the test patterns generated are removed from the list of targeted faults. In another implementation using multiple-detect ATPG, however, a fault is not dropped until its number of detections reaches a predefined limit. Further, in certain embodiments, the number of times a fault is detected before being dropped may be increased in order to create a higher likelihood of detecting the untargeted defects using the SPE cubes.

At process block 422, a determination is made as to whether any further faults remain in the list of the targeted faults. If so, then the procedure is repeated; otherwise, the method 400 terminates.

In certain implementations of the technique, the steps are rearranged or performed concurrently. For example, in one particular implementation, the first two procedures are reversed; that is, the additional test values for increasing the detectability of untargeted defects (e.g., SPE cubes) are generated before the test values for the targeted faults are determined.

Further, in still another embodiment, process block 410 is removed entirely and the one or more test patterns generated entirely comprise the test values configured to enhance the probability that a particular node associated with an untargeted defect will have a desired value or a desired dynamic behavior.

Figure 5:
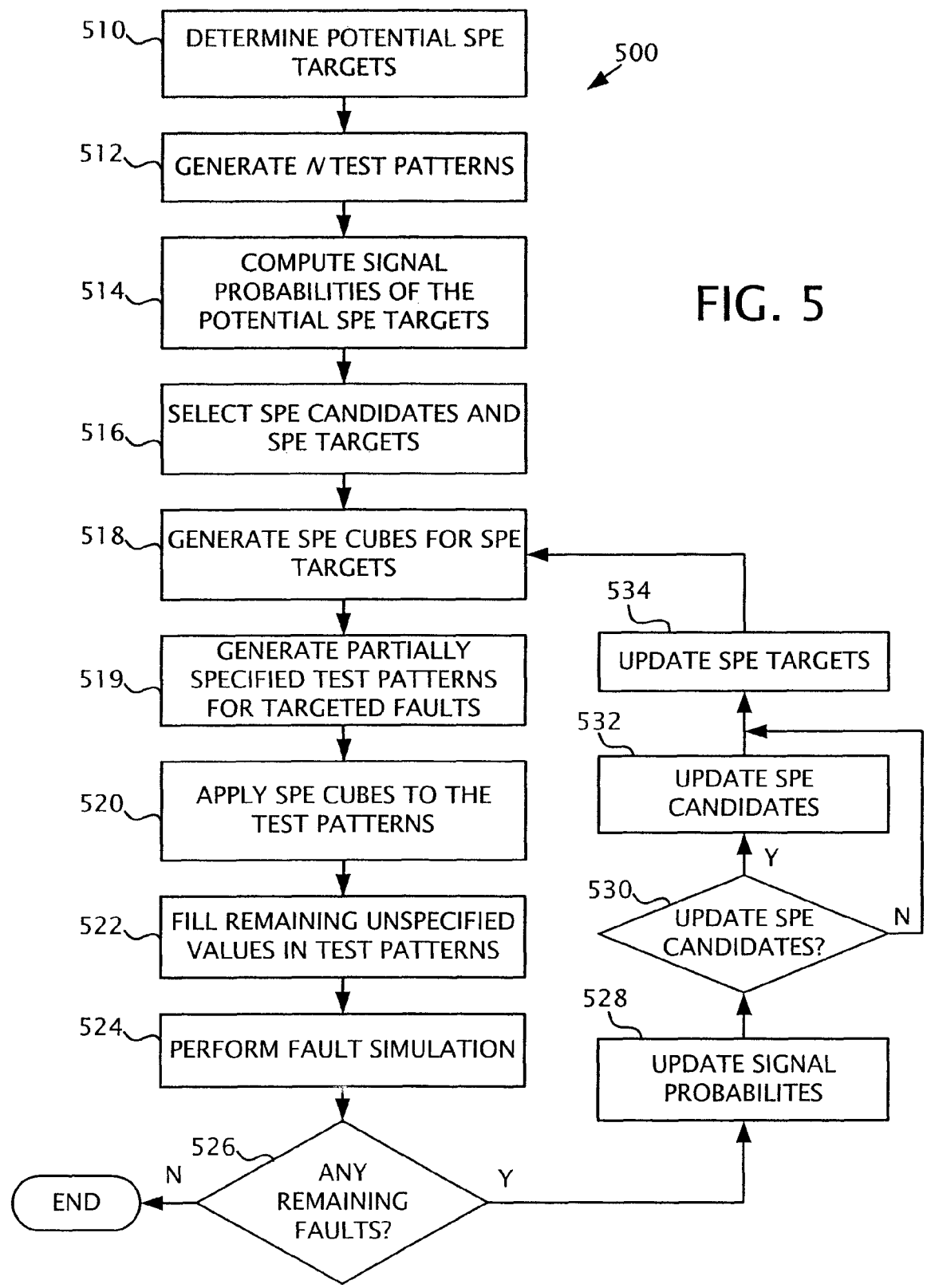
FIG. 5 is a flowchart of a second exemplary method for generating test patterns according to the disclosed technology.

FIG. 5 is a flowchart 500 of a more specific embodiment of an enhanced ATPG technique. This specific embodiment concerns the creation of SPE cubes for increasing the likelihood of detecting bridging defects that cause static bridging faults, though it can be modified by one of ordinary skill in the art to relate to other types of possible defects (e.g., resistive bridges and cross-talk effects). The particular values and limits recited in connection with this method should not be construed as limiting in any way, however, as they merely illustrate one particular implementation.

At process block 510, potential SPE targets are determined and added to a list of SPE targets. For example, in one implementation, the stems in subsets of fanout-free regions in a circuit design are added to the list. The list may include, for example, the names of the signal lines associated with the stems.

At process block 512, a predetermined number (N) of test patterns for testing targeted faults are generated. For example, the test patterns may comprise stuck-at-fault test patterns generated using any of the ATPG techniques described above or any other conventional ATPG technique.

At process block 514, the 1- and 0-probabilities of the potential SPE targets are computed. For example, the probabilities may be computed using signal value statistics collected by simulating the N test patterns using a logic simulator. Desirably, N should be large enough to compute accurate estimates of the 1- and 0-probabilities of the potential signal probability enhancement targets. For example, in one particular implementation, N is set as 512.

At process block 516, the particular nodes to be enhanced using SPE cubes are selected. For example, according to one exemplary embodiment, two classes (or subsets) of nodes are selected from the potential SPE targets determined at process block 510. Specifically, all the potential SPE targets from the list of SPE targets having a 0-probability or 1-probability value less than a predefined threshold (e.g. 0.1) are selected as "SPE candidates." The SPE candidates may be put into a separate list of SPE candidates. Because the number of SPE candidates may be too large to be efficiently targeted for each test pattern, a subset of SPE candidates, termed "SPE targets," may be selected and put into a separate list of SPE targets. The list of SPE targets may contain, for example, up to 1000 SPE targets.

At process block 518, SPE cubes are generated for the SPE targets. In some embodiments, SPE cubes are also generated for the SPE candidates. In general, multiple SPE cubes can be generated for each SPE target or SPE candidate if no SPE cube has been generated for it before. In certain implementations, a maximum number of SPE cubes generated for a particular SPE target or SPE candidate is set (e.g., up to three SPE cubes per SPE target).

At process block 519, one or more partially specified test patterns for testing targeted faults are generated (e.g., a fixed number of partially specified test patterns, such as 32). For example, the test patterns may comprise test patterns generated using any of the ATPG techniques described above or any other conventional ATPG technique.

At process block 520, the SPE cubes are applied to the partially specified test patterns. In one exemplary implementation, an attempt is made to merge one respective SPE cube per SPE target into each of the test patterns. Thus, this process involves specifying or replacing unspecified values with one or more of the SPE cubes. Merging is successful if the SPE cube to be merged is compatible with the generated test pattern (which may possibly include SPE cubes for SPE targets considered earlier). In some implementations, the SPE targets with more strongly biased signal probabilities are given higher priority during this method act. A random coefficient can also be introduced into the priority computation to improve the randomness of the SPE target ordering.

At process block 522, the remaining unspecified portion of the test patterns are filled. For example, the remaining unspecified values may be filled with random values or values configured to reduce power consumption during testing.

At process block 524, fault simulation is performed using the test patterns. A fault detection profile can be updated using the simulation results.

At process block 526, a determination is made as to whether there are remaining faults to be detected. In certain embodiments that utilize a multiple-detect technique, a fault will be considered to be covered only if it is detected a specified number of times during application of the test patterns. If no further faults remain to be detected, the method 500 terminates; otherwise, the method continues at process block 528.

At process block 528, the signal probabilities for the potential SPE targets, the SPE candidates, and the SPE targets are updated (e.g., using the results from the fault simulation). At process block 530, a determination is made as to whether the list of SPE candidates should be updated. This determination may be made, for example, based on the number of test patterns that have been enhanced using SPE cubes. For instance, in one particular implementation, the SPE candidates are updated every time a fixed number of test patterns are enhanced (e.g., 128).

If the SPE candidates are to be updated, then at process block 532, the SPE candidates are updated using the updated signal probabilities Because the signal probabilities of the potential SPE targets may have changed as a result of the test patterns being modified to include SPE cubes, new SPE candidates may now be selected from the list of potential SPE targets.

At process block 534, the SPE targets are updated using the updated signal probabilities. Thus, in the illustrated embodiment, the lists of SPE targets and candidates are periodically updated to account for the effect of the modified test patterns as they are being produced. The method 500 returns to process block 518, where SPE cubes are generated for the updated SPE targets and applied to a next set of test patterns (e.g., the next 32 or other predetermined number of partially specified test patterns, or previously considered test patterns still having unspecified values).

In other embodiments, the disclosed method 500 can be adapted for transition fault ATPG in order to improve the detection probability of untargeted resistive bridges and cross-talk effects. For example, to enhance the coverage of cross-talk faults, SPE cubes can be generated and applied to create the necessary opposite-polarity transition at the aggressor node for fault activation.

Signal Probability Enhancement and Test Data Compression

When test data volumes are reduced using encoding or compression techniques (such as EDT), the unspecified values in the tests are typically filled by some form of decompressor during the actual circuit test. Thus, filling unspecified values in tests by embedding SPE cubes may reduce the achievable test data volume compression. For this reason, it is desirable in certain implementations of the disclosed technology to limit the number of SPE cubes included in a test pattern. For test data compression techniques (such as EDT), one can compute the maximum number of specified test values that can be included in a particular test pattern.

An exemplary manner of performing this computation is as follows. For a design with NFF scan cells, let the targeted test data compression ratio be CR and let the encoding efficiency of the compression scheme be $\eta$. The allowed maximum number of specified bits in a test pattern (which typically includes the specified bits for SSL faults and the specified bits of the SPE cubes) is $\eta*NFF/CR$. Thus, for example, given a newly generated partially specified test pattern (as in process block 519 of the method 500), one can embed SPE cubes so long as the total number of specified bits in the test pattern is less than or equal to $\eta*NFF/CR$.

Exemplary Embodiments of Hybrid ATPG

If physical layout data is available for a circuit design (e.g., in the form of a GDSII or Oasis file), bridging defects can be extracted and sorted based on their weighted critical area (WCA). The bridges with high WCA values can be selected as targets for ATPG. This type of technique is typically referred to as a "defect-based test" (DBT) technique. However, the DBT technique may still leave undetected a large number of untargeted, low-probability bridges or unmodeled defects (such as multiple node bridges). The detectability of these remaining untargeted defects, however, can be increased using embodiments of the disclosed technology.

For example, and according to one exemplary embodiment, a multiple-detect technique that explicitly targets SSL faults but incidentally covers bridging faults can be used in conjunction with the defect-base-test technique. Moreover, either or both of the test pattern generation techniques may utilize aspects of the disclosed technology to increase the effectiveness of the test patterns in detecting the untargeted defects.

Figure 6:
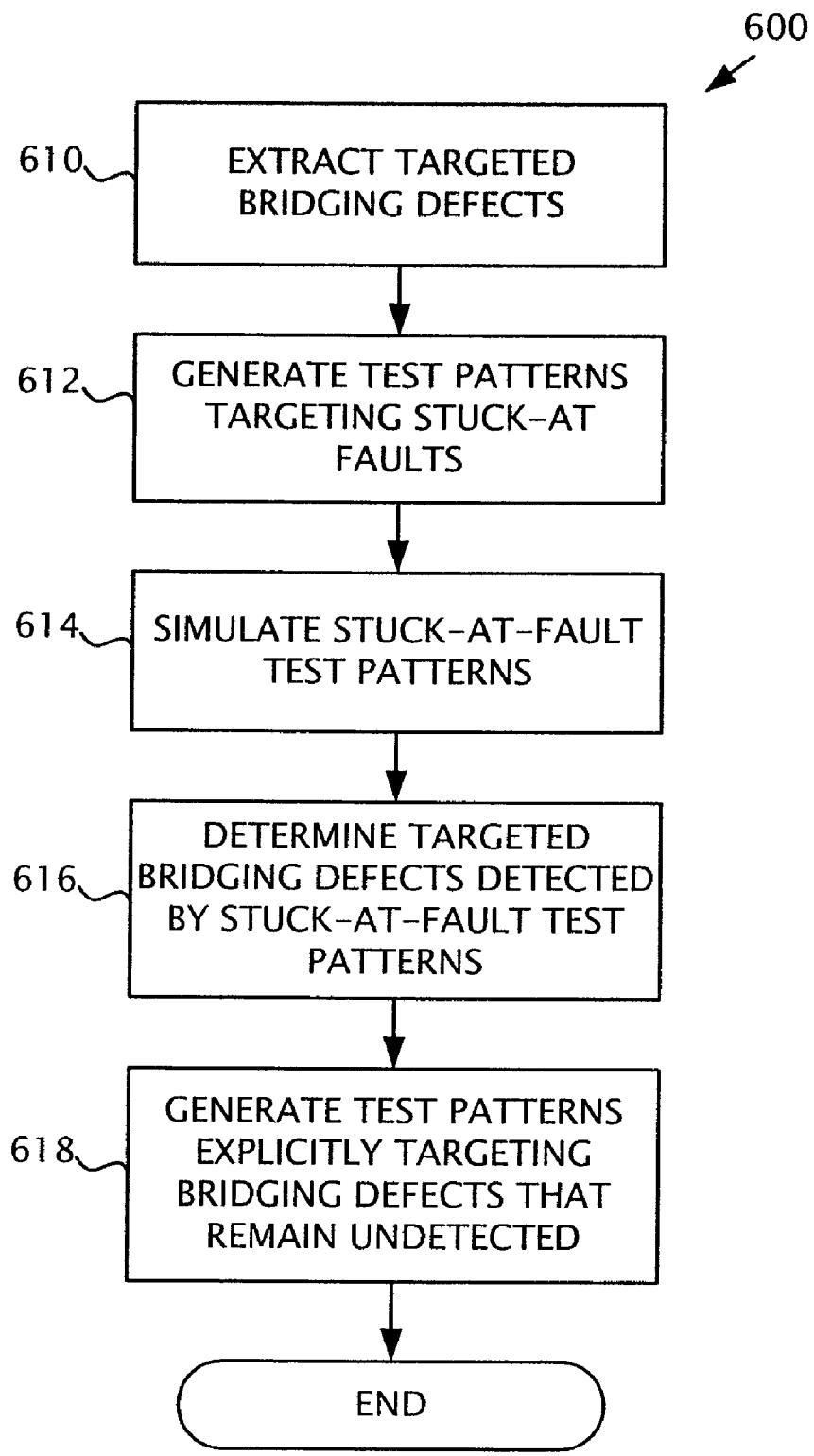
FIG. 6 is a flowchart of an exemplary method of a hybrid automatic test pattern generation (ATPG) technique that may utilize aspects of the disclosed technology.
Figure 7A:
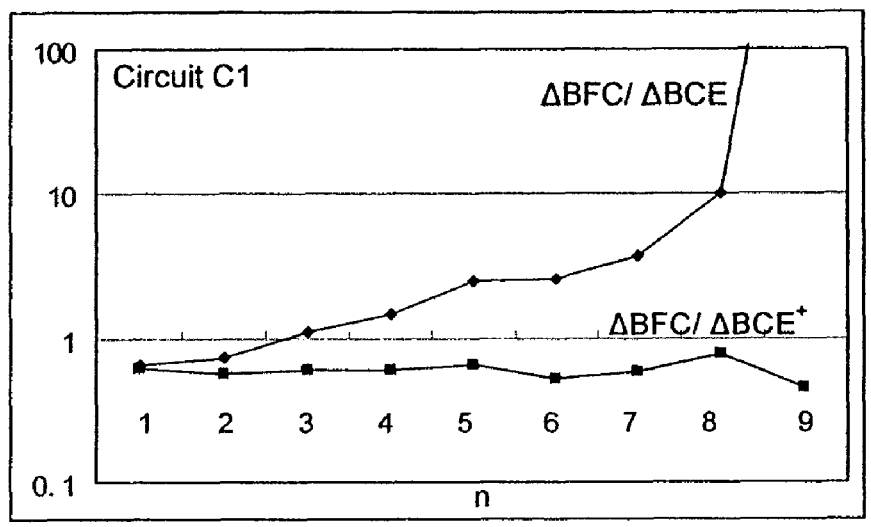
FIGS. 7(A)-7(D) are graphs showing a comparison between a conventional ATPG technique and an ATPG technique according to an embodiment of the disclosed technology as applied to four industrial designs.
Figure 7B:
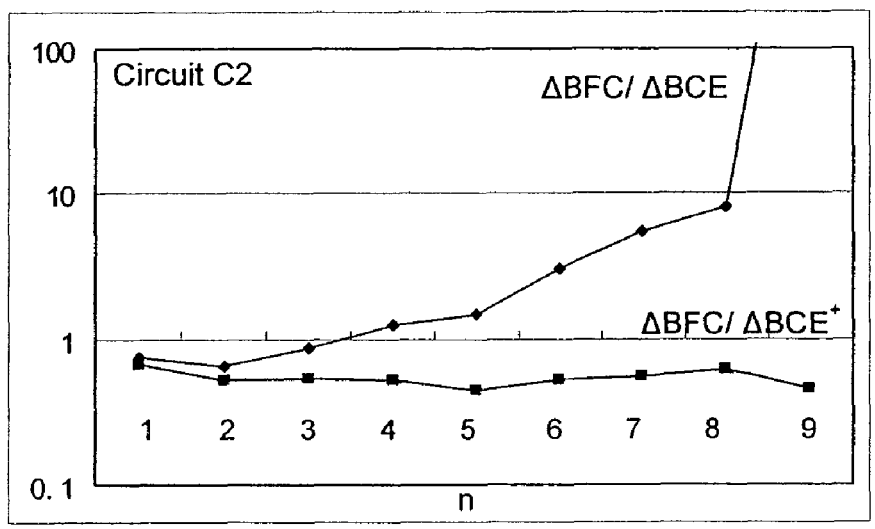
Figure 7C:
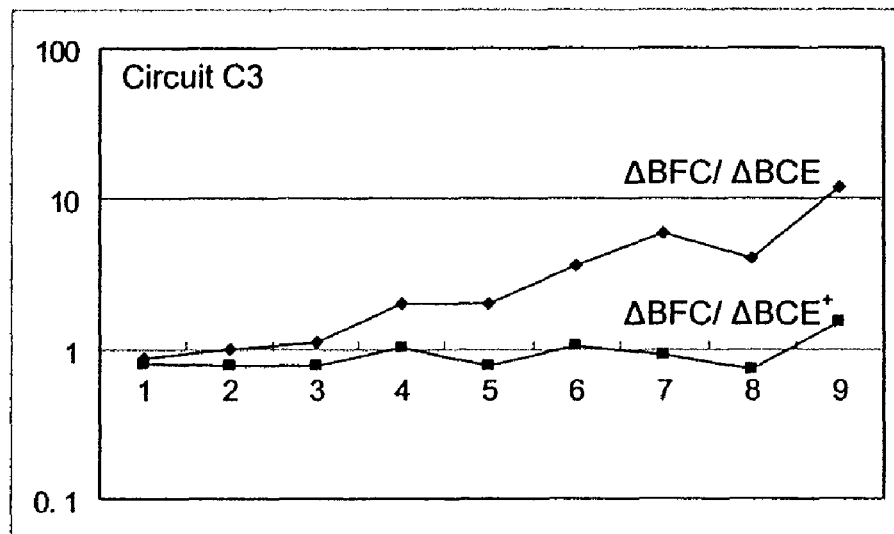
Figure 7D:
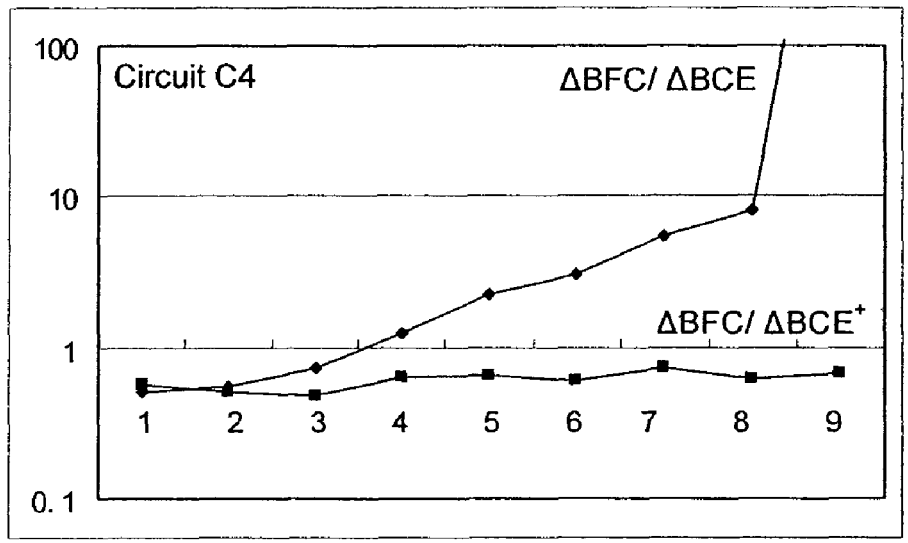

FIG. 6 shows a flowchart 600 of one exemplary embodiment of a hybrid ATPG/DBT technique. At process block 610, bridging defects to be targeted during test pattern generation are selected. For example, in one particular implementation, the bridging defects are extracted from physical layout data representative of the integrated circuit to be tested. Specifically, the WCA values for the bridging defects can be determined and those bridging defects having WCA values above a certain threshold selected.

At process block 612, test patterns for SSL faults are generated. For example, in one particular implementation, ATPG is performed for the SSL faults using the multiple-detect approach, wherein a fault is observed a fixed number of times (n) before being deemed detected and thus removed from the list of targeted faults.

At process block 614, application of the test patterns to the integrated circuit is simulated in the presence of the SSL faults and the targeted bridging defects.

At process block 616, a determination is made based at least in part on results from the fault simulation as to which of the targeted bridging defects are detectable using the SSL test patterns.

At process block 618, all remaining bridging faults are explicitly targeted and corresponding test patterns for testing the targeted bridging faults are generated. Thus, additional test patterns are generated that explicitly target the remaining targeted bridging faults.

Embodiments of the technology described above for enhancing the probability of detecting untargeted defect can be utilized in either or both of the test pattern generation phases in the method 600. For example, using embodiments of the techniques described above, more bridging faults can be detected and dropped during ATPG for SSL faults. Consequently, the total number of remaining bridging faults to be explicitly targeted at process block 618 can be reduced. The size of the final test set and the total test pattern generation time will also be reduced.

In certain implementations, the order of the procedures can be rearranged or performed concurrently. For example, the order of the two test pattern generation procedures can be reversed; that is, the ATPG procedure targeting the extracted bridging defects can be performed first, followed by the multiple-detect ATPG for SSL faults. It has been observed, however, that performing the stuck-at-fault ATPG first normally delivers a smaller test set.

Experimental Results

Exemplary embodiments of the disclosed technology were implemented and tested in a state-of-the-art commercial ATPG tool. In particular, the exemplary technique described above with respect to FIG. 5 was utilized. The modified ATPG tool is referred to below as "SPE ATPG."

In a first experiment, for each one of four industrial designs studied, two sets of n-detect test patterns were generated for SSL faults using the original ATPG tool and SPE ATPG for n=1 to 10. Both test sets were then fault simulated using 100K randomly selected bridges using a 4-way bridging fault model (resulting in 400K 4-way bridging faults). Results of the experiments for the first two industrial circuits (denoted as "C1" and "C2") are shown in Table 1(a), whereas results for the second two industrial designs (denoted as "C3" and "C4") are shown in Table 1(b) below.

TABLE 1(a)

Conventional n-detect test sets vs. SPE n-detect test sets

| Ckt | | D1 | D2 | D3 | D4 | D5 | D6 | D7 | D8 | D9 | D10 |
|---|---|---|---|---|---|---|---|---|---|---|---|
| C1 | #TP | 5400 | 8311 | 11591 | 14870 | 18191 | 21411 | 24744 | 27716 | 31104 | 34151 |
| #G = 344K | | 5352 | 8229 | 11692 | 15028 | 18245 | 21456 | 24777 | 27970 | 31180 | 34165 |
| #SC = 20K | RT | 1.00 | 1.47 | 2.03 | 2.68 | 3.51 | 3.95 | 4.69 | 5.31 | 6.49 | 7.37 |
| | | 1.09 | 1.58 | 2.19 | 2.87 | 3.51 | 4.42 | 4.99 | 5.72 | 6.53 | 7.31 |
| | BFC | 91.05 | 92.53 | 93.38 | 93.90 | 94.25 | 94.49 | 94.66 | 94.86 | 94.98 | 95.06 |
| | | 93.11 | 94.70 | 95.53 | 96.05 | 96.37 | 96.62 | 96.75 | 96.86 | 96.96 | 97.01 |
| | BCE | 91.13 | 93.67 | 94.85 | 95.35 | 95.59 | 95.69 | 95.75 | 95.78 | 95.79 | 95.79 |
| | | 91.33 | 93.76 | 94.91 | 95.38 | 95.60 | 95.70 | 95.75 | 95.78 | 95.79 | 95.79 |
| | BCE+ | 85.23 | 87.69 | 89.07 | 89.83 | 90.37 | 90.72 | 90.94 | 91.18 | 91.36 | 91.51 |
| | | 86.98 | 89.56 | 91.03 | 91.90 | 92.44 | 92.82 | 93.07 | 93.26 | 93.39 | 93.50 |
| C2 | #TP | 2252 | 3597 | 5092 | 6600 | 7964 | 9292 | 10768 | 12145 | 13649 | 15119 |
| #G = 543K | | 2296 | 3663 | 5206 | 6735 | 8157 | 9494 | 10961 | 12418 | 13847 | 15550 |
| #SC = 45K | RT | 1.00 | 1.43 | 1.99 | 2.67 | 3.42 | 4.19 | 4.91 | 5.73 | 6.52 | 7.23 |
| | | 1.06 | 1.55 | 2.12 | 2.81 | 3.58 | 4.42 | 5.20 | 6.00 | 6.78 | 8.72 |
| | BFC | 95.03 | 96.35 | 97.02 | 97.38 | 97.66 | 97.85 | 98.01 | 98.13 | 98.22 | 98.26 |
| | | 95.40 | 96.72 | 97.38 | 97.72 | 97.98 | 98.14 | 98.29 | 98.40 | 98.48 | 98.53 |
| | BCE | 94.12 | 95.89 | 96.93 | 97.34 | 97.55 | 97.66 | 97.71 | 97.73 | 97.74 | 97.74 |
| | | 94.17 | 95.92 | 96.94 | 97.34 | 97.55 | 97.66 | 97.71 | 97.73 | 97.74 | 97.74 |
| | BCE+ | 89.73 | 91.63 | 92.84 | 93.57 | 94.01 | 94.45 | 94.71 | 94.90 | 95.03 | 95.13 |
| | | 90.50 | 92.49 | 93.74 | 94.37 | 94.87 | 95.23 | 95.52 | 95.72 | 95.85 | 95.96 |

TABLE 1(b)

Conventional n-detect test sets vs. SPE n-detect test sets

| Ckt | | D1 | D2 | D3 | D4 | D5 | D6 | D7 | D8 | D9 | D10 |
|---|---|---|---|---|---|---|---|---|---|---|---|
| C3 | #TP | 2126 | 2694 | 3707 | 4536 | 5380 | 6249 | 7071 | 7946 | 8753 | 9669 |
| #G = 1.21 M | | 2101 | 2669 | 3731 | 4557 | 5423 | 6327 | 7072 | 8034 | 8873 | 9733 |
| #SC = 70K | RT | 1.00 | 1.35 | 1.88 | 2.41 | 3.15 | 3.73 | 4.46 | 5.26 | 6.04 | 6.54 |
| | | 1.10 | 1.56 | 2.22 | 2.67 | 3.32 | 3.95 | 4.61 | 5.30 | 6.30 | 6.88 |
| | BFC | 92.80 | 94.44 | 95.43 | 95.98 | 96.34 | 96.57 | 96.77 | 96.92 | 97.04 | 97.15 |
| | | 94.17 | 95.66 | 96.53 | 96.95 | 97.31 | 97.51 | 97.69 | 97.81 | 97.89 | 98.01 |
| | BCE | 94.50 | 96.58 | 97.62 | 98.03 | 98.24 | 98.35 | 98.40 | 98.43 | 98.45 | 98.46 |
| | | 95.07 | 96.81 | 97.70 | 98.08 | 98.26 | 98.36 | 98.41 | 98.43 | 98.45 | 98.46 |
| | BCE+ | 89.62 | 91.81 | 93.09 | 93.75 | 94.15 | 94.45 | 94.67 | 94.82 | 94.92 | 95.04 |
| | | 91.19 | 93.09 | 94.23 | 94.78 | 95.13 | 95.39 | 95.56 | 95.69 | 95.80 | 95.88 |
| C4 | #TP | 7937 | 11156 | 15399 | 19492 | 23254 | 27212 | 30959 | 35304 | 39299 | 43253 |
| #G = 1.21 M | | 7985 | 11419 | 15643 | 19706 | 23592 | 27487 | 31498 | 35706 | 39946 | 43632 |
| #SC = 70K | RT | 1.00 | 1.20 | 1.63 | 2.13 | 2.73 | 3.38 | 4.08 | 4.74 | 5.42 | 6.10 |
| | | 1.13 | 1.35 | 1.84 | 2.33 | 2.95 | 3.59 | 4.24 | 4.94 | 5.61 | 6.35 |
| | BFC | 93.88 | 94.61 | 95.11 | 95.38 | 95.59 | 95.77 | 95.89 | 96.00 | 96.08 | 96.18 |
| | | 94.26 | 94.89 | 95.35 | 95.63 | 95.82 | 95.98 | 96.09 | 96.17 | 96.27 | 96.34 |
| | BCE | 95.32 | 96.78 | 97.69 | 98.06 | 98.23 | 98.31 | 98.35 | 98.37 | 98.38 | 98.38 |
| | | 95.44 | 96.84 | 97.71 | 98.09 | 98.23 | 98.32 | 98.35 | 98.37 | 98.38 | 98.38 |
| | BCE+ | 88.87 | 90.17 | 91.16 | 91.73 | 92.06 | 92.34 | 92.54 | 92.69 | 92.82 | 92.97 |
| | | 89.22 | 90.53 | 91.52 | 92.08 | 92.38 | 92.66 | 92.88 | 93.01 | 93.16 | 93.27 |

In Tables 1(a) and 1(b), the circuit designation is shown in the first column, which also includes the number of gates (#G) and the number of scan cells (#SC) in the circuit. For each circuit, the number of test patterns (#TP), the run times (RT), the percent of the 400K 4-way bridging faults detected by the test sets (the bridge fault coverage (BFC)), bridge coverage estimate (BCE), and the improved bridge coverage estimate (BCE$^+$) are reported. The remaining columns (denoted as D1 through D10) report data for n-detect test sets, for n=1 to 10, respectively. The data for the ten pairs of n-detect test sets are arranged in two consecutive rows, with the data for the original ATPG tool being shown in the first respective row and the data for the SPE ATPG tool being shown in the second row. The run times reported are normalized run times obtained by dividing the run times by the time to generate the standard single detection tests for SSL faults using the original ATPG.

It can be observed from Tables 1(a) and 1(b) that for all circuits, every n-detect test set obtained by SPE ATPG achieved higher bridging fault coverage than the corresponding test sets obtained by the original ATPG. Moreover, the higher bridging fault coverage was obtained with only a small increase in run time and test pattern count. On average, the 1-detect test sets of SPE ATPG had 0.1% more patterns than 1-detect test sets of the original ATPG tool, and the pattern count increase was 0.8% for 10-detect test sets. The average increase in run time for SPE ATPG was 8.8% for 1-detect tests and 7.4% for 10-detect tests. The average increase in bridging fault coverage (BFC) obtained by using the exemplary SPE technique was 1.05% for 1-detect test sets and 0.81% for 10-detect test sets.

The data in Tables 1(a) and 1(b) also shows that one can use the disclosed technology to derive higher quality tests that are capable of achieving the same or higher unmodeled defect coverage using smaller run times and pattern counts. For example, the 10-detect test set for circuit C1 generated by using the original ATPG had 34,151 test patterns and a relative run time of 7.37. These test patterns achieved bridging fault coverage of 95.06%. However, using the exemplary SPE technique, one can achieve 95.53% bridging fault coverage with 3-detect tests, which contain 11,692 test patterns and use a relative run time of 2.19.

Turning now to the data related to the bridge coverage estimate measures (BCE and BCE$^+$), one objective of such measures is to determine the incremental defect coverage obtained when additional tests are added to a given test set. For example, one can use the metrics to estimate the additional unmodeled defect coverage obtained with increasing values of n when n-detect tests are used. FIGS. 7(A) through 7(D) are graphs 700, 702, 704, and 706, respectively, that show the ratio between the increases in bridging fault coverage (ΔBFC) and BCE (ΔBCE) (denoted in FIGS. 7(A) through 7(D) as ΔBFC/ΔBCE), as well as the ratio between the increases in bridging fault coverage (ΔBFC) and BCE$^+$ (ΔBCE$^+$) (denoted as ΔBFC/ΔBCE$^+$), as the value of n in the n-detect test patterns is increased. When the BCE saturates, the ratio ΔBFC/ΔBCE can be very large. For this reason, the vertical axes in FIGS. 7(A) through 7(D) use a logarithmic scale. From these plots, it can be observed that BCE$^+$ provides a better estimate of the increase in unmodeled defect coverage as additional tests are added because the plots for ΔBFC/ΔBCE$^+$ are relatively flat as n increases, whereas the plots for ΔBFC/ΔBCE rise steeply.

The second experiment performed evaluated the relative quality of test patterns generated using the SPE ATPG tool when the total number of specified bits in the test patterns was restricted to be less than or equal to a maximum value. For this experiment, it was assumed that the EDT test data compression technique was used with a target compression ratio of 32× and an encoding efficiency of 0.95. See J. Rajski, et al., "Embedded deterministic test for low cost manufacturing test," *Proc. ITC* 2002, pp. 301-310 (2002)). For the particular circuit design considered, this meant that the number of test-pattern values that could be specified was restricted to less than 3% of the number of circuit scan cells. Using this limit on the number of specified bits in test patterns, 1-detection test sets were generated with and without using the exemplary SPF technique. The results of this experiment are shown in Table 2 below.

TABLE 2

Enhanced ATPG under EDT (C.R. = 32X)

| | Original ATPG | | | SPE ATPG | | |
|---|---|---|---|---|---|---|
| Ckt | #TP | SAFC (%) | BFC (%) | #TP | SAFC (%) | BFC (%) |
| C1 | 5757 | 97.13 | 90.95 | 5860 | 97.13 | 92.74 |
| C2 | 2755 | 98.38 | 94.97 | 2663 | 98.38 | 95.53 |
| C3 | 2502 | 98.74 | 92.61 | 2475 | 98.74 | 93.74 |
| C4 | 9116 | 98.66 | 93.82 | 8857 | 98.66 | 94.20 |

The first column (Ckt) identifies the circuit. The following columns report the number of test patterns (#TP), the SSL fault coverage (SAFC), and the fault coverage of 400K randomly selected 4-way bridging faults (BFC) for both the original ATPG tool and the SPE ATPG tool. From Table 2, it can be seen that compared to the original ATPG tests, the SPE ATPG tests achieved higher bridging fault coverage and the same SSL fault coverage. For three of the four circuits, the pattern counts were less for the SPE-based tests. These results show that the exemplary SPE technique can be used to improve the ability of tests to detect unmodeled defects without reducing the achievable test data compression.

The third experiment was performed to investigate the effect of the exemplary SPE technique when the faults targeted for test generation included SSL faults as well as bridging faults extracted from the circuit layout (e.g., from a GDSII file). This approach may be used to generate tests for so-called realistic bridges and unmodeled defects targeted using n-detect tests for SSL faults. For circuit C1, 800K realistic bridges were extracted. Using the extracted bridges and the SSL faults, tests were generated with and without using the SPE technique. In particular, a 1-detect test set (Orig_D1_H) targeting the realistic bridges was generated using a DBT approach. A second test set (SPE_D1_H) was generated with the exemplary SPE technique. Two other corresponding test sets (Orig_D3_H and SPE_D3_H) were also generated with guaranteed 3-detection of SSL faults. These four test sets were fault simulated using an additional 400K randomly selected 4-way bridging faults. The results of this experiment are reported in Table 3.

TABLE 3

Hybrid ATPG for Design C1

| Test Set | #TP | BFC$^{Ex}$ (%) | BFE$^{Ex}$ (%) | BFC$^{Rd}$ (%) |
|---|---|---|---|---|
| Orig_D1_H | 13278 | 90.17 | 99.75 | 93.64 |
| SPE_D1_H | 12431 | 90.18 | 99.76 | 95.28 |
| Orig_D3_H | 17441 | 90.17 | 99.75 | 94.44 |
| SPE_D3_H | 16353 | 90.18 | 99.76 | 96.20 |

The coverage of realistic bridges is reported in the third column (BFC$^{Ex}$), whereas the coverage of randomly selected bridges is shown in the fifth column (BF$^{Rd}$). The fourth column (BFE$^{Ex}$) reports the fault efficiency, computed as the percentage of detected faults out of the detectable faults obtained by subtracting the faults proven, to be untestable by the ATPG. It can be seen in Table 3 that all test sets essentially achieve comparable coverage of the realistic bridging faults. However, the SPE-based test sets achieved higher coverage of unmodeled (untargeted) bridging faults and contained fewer test patterns.

The last experiment performed was designed to investigate the application of the exemplary SPE technique to cross-talk faults. For this experiment, single-detect transition-fault test sets based on the launch-by-shift mode were generated with and without the exemplary SPE technique. The SPE technique was used to improve the transition probability for signal nodes that were strongly biased when randomly specified. The test sets were fault simulated using 100K randomly selected cross-talk faults. Results from the fault simulation are shown in Table 4.

TABLE 4

Enhanced ATPG for Cross-Talk Faults

| | Original ATPG | | | SPE ATPG | | |
|---|---|---|---|---|---|---|
| Ckt | #TP | TFC (%) | CFC (%) | #TP | TFC (%) | CFC (%) |
| C1 | 8109 | 90.78 | 67.42 | 8218 | 90.78 | 71.03 |
| C2 | 3101 | 94.36 | 78.32 | 3084 | 94.35 | 80.30 |
| C3 | 3118 | 95.00 | 74.14 | 3154 | 95.03 | 77.33 |
| C4 | 15556 | 94.12 | 81.06 | 15606 | 94.12 | 82.21 |

Table 4 reports the number of test patterns (#TP), the coverage of transition faults (TFC), and the coverage of randomly selected cross-talk faults (CFC) for each of the test sets as applied to the four industrial designs. It can be seen that for all circuits, the SPE test set (SPE ATPG) achieved the same transition fault coverage and higher cross-talk fault coverage than the original test set (Original ATPG). Moreover, the higher cross-talk fault coverage was obtained with only a minimal increase in test pattern count. On the average, the SPE test sets had 0.6% more patterns than the original 1-detect transition fault test sets. Further, the average improvement in cross-talk fault coverage obtained by using SPE technique was 2.48%.

Exemplary Computing Environments

Figure 8:
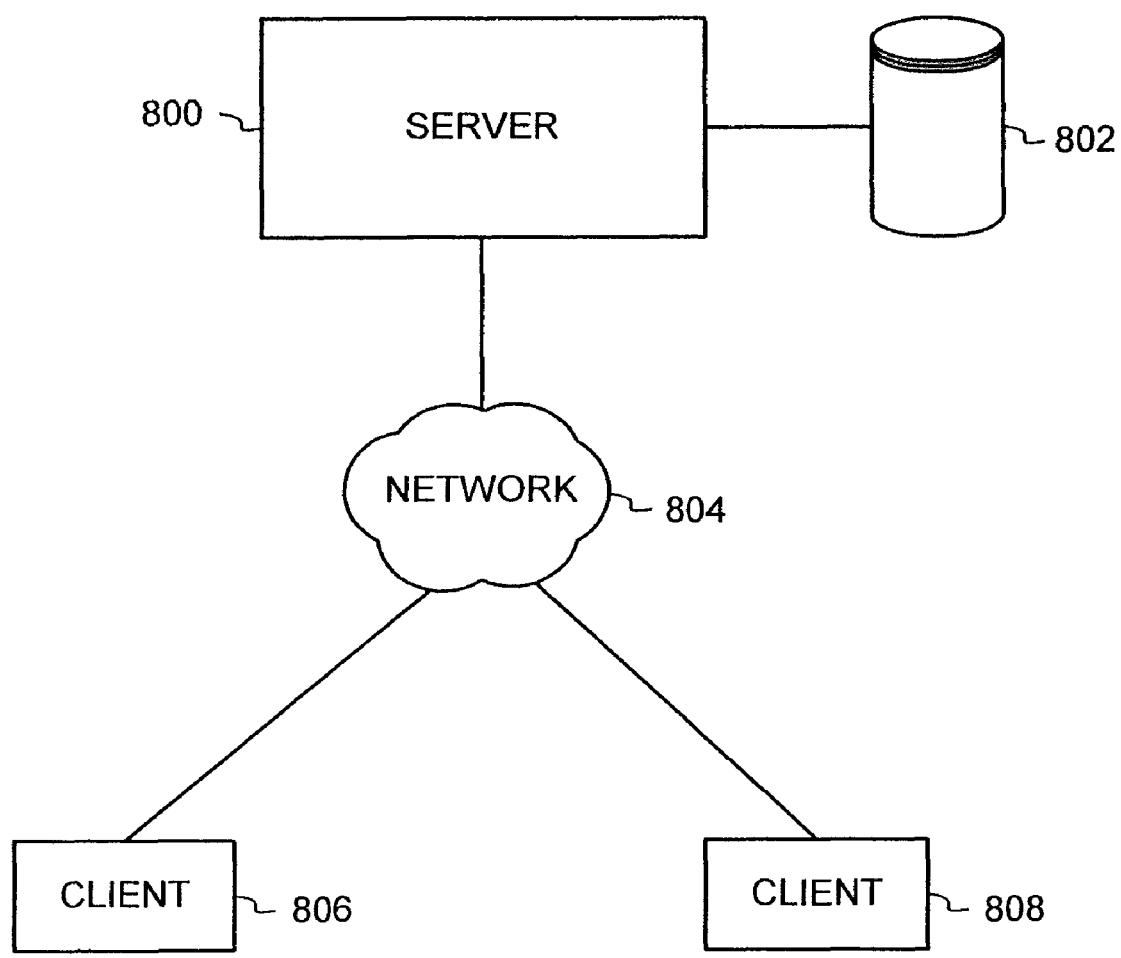
FIG. 8 is a system diagram of a client/server network as may be used in generating test patterns according to any of the disclosed embodiments.

Any of the aspects of the technology described above may be performed using a distributed computer network. FIG. 8 shows one such exemplary network. A server computer 800 can have an associated storage device 802 (internal or external to the server computer). For example, the server computer 800 can be configured to generate test patterns according to any of the embodiments described above (e.g., as part of an EDA software tool, such as an ATPG tool). The server computer 800 may be coupled to a network, shown generally at 804, which can comprise, for example, a wide-area network, a local-area network, a client-server network, the Internet, or other such network. One or more client computers, such as those shown at 806, 808, may be coupled to the network 804 using a network protocol. The work may also be performed on a single, dedicated workstation, which has its own memory and one or more CPUs.

Figure 9:
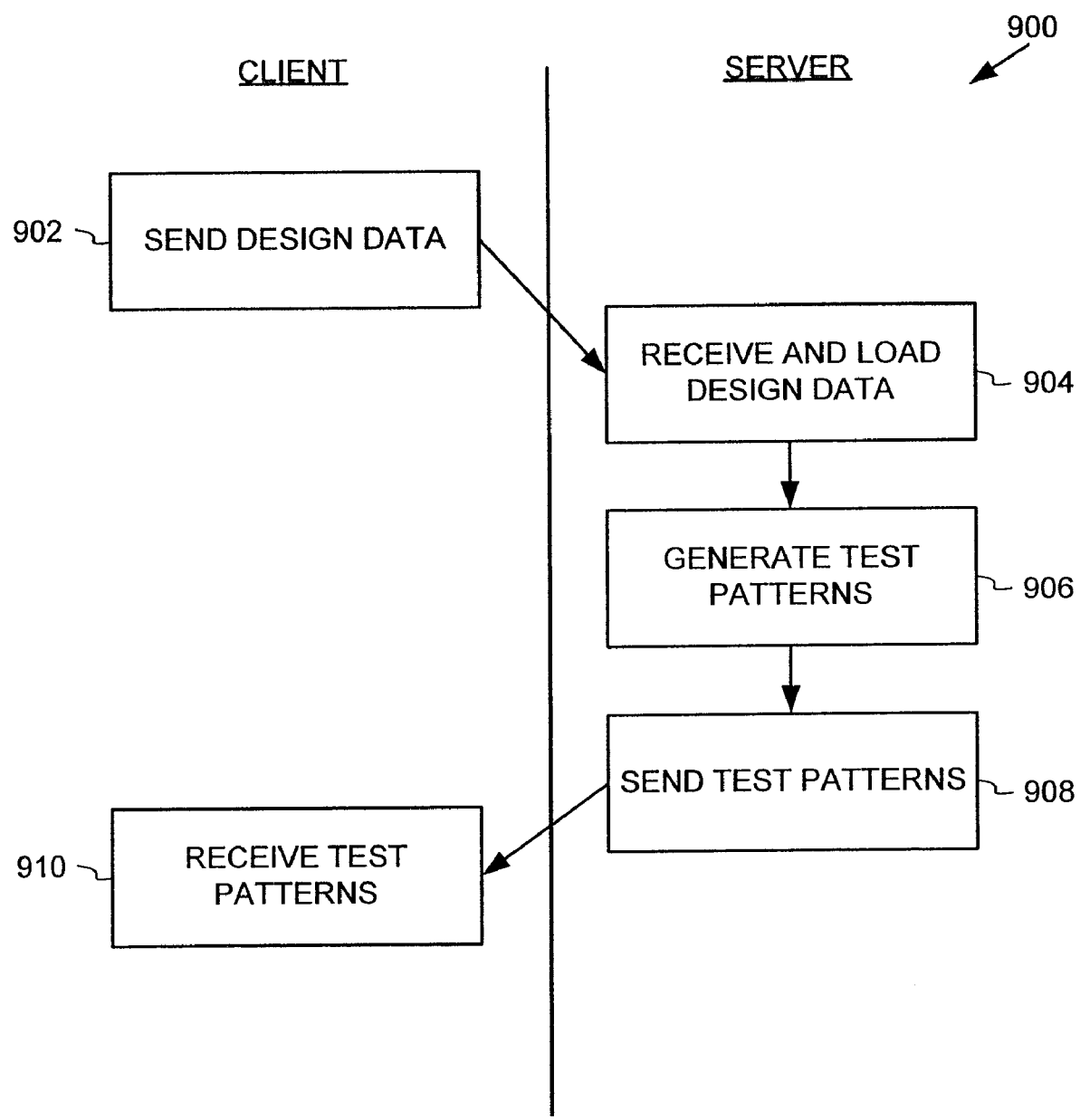
FIG. 9 is a flowchart showing the creation of test patterns using, for example, the network of FIG. 8.

FIG. 9 shows that a database or data structure containing design information (e.g., an HDL file, such as a Verilog or VHDL file) may be analyzed and have test patterns generated for it according to any of the embodiments disclosed herein using a remote server computer, such as the server computer 800 shown in FIG. 8. At process block 802, for example, the client computer sends design data relating to an integrated circuit for which test patterns are to be generated (e.g., a scan-based or partially-scan-based circuit). For instance, the client computer may send a Verilog or VHDL file or other EDA design file. In process block 804, the design data is received and loaded by the server computer. In process block 806, test patterns are generated for testing the integrated circuit represented by the design data according to any of the disclosed embodiments. At process block 808, the server computer sends the test patterns to the client computer, which receives the test patterns at process block 810. It should be apparent to those skilled in the art that the example shown in FIG. 8 is not the only way to generate test patterns using multiple computers. For instance, the design data may be stored on a computer-readable medium that is not on a network and that is sent separately to the server (e.g., a CD-Rom, DVD, or portable hard drive). Or, the server computer may perform only a portion of the test-pattern generation procedures.

Having illustrated and described the principles of the disclosed technology, it will be apparent to those skilled in the art that the disclosed embodiments can be modified in arrangement and detail without departing from such principles. In view of the many possible embodiments, it will be recognized that the illustrated embodiments include only examples and should not be taken as a limitation on the scope of the disclosed technology. Rather, the disclosed technology includes all novel and nonobvious features and aspects of the various disclosed apparatus, methods, systems, and equivalents thereof, alone and in various combinations and subcombinations with one another.

What is claimed is:

1. A computer-implemented method for generating test patterns in an electronic design automation (EDA) environment, comprising:
    using a computer, determining a first set of one or more test values for testing a circuit design, the first set of test values being configured to enhance a probability that a node associated with an untargeted fault will have a desired value during testing;
    generating a test pattern to be applied to the circuit design during testing, the test pattern comprising the first set of test values; and
    storing the test pattern in one or more computer-readable storage media.

2. The method of claim 1, wherein the test pattern further comprises a second set of one or more test values for testing the circuit design, the second set of test values being configured to test one or more targeted faults using fault models associated with targeted defects.

3. The method of claim 2, wherein the targeted faults comprise one or more bridging defects extracted from physical layout data.

4. The method of claim 1, wherein the determining the first set of one or more test values comprises calculating a probability that the node will have the desired value during application of a previously determined set of test patterns.

5. The method of claim 1, wherein the generating the test pattern is performed so as not to exceed a maximum number of specified values allowed, the maximum number of specified values allowed being dependent on a compression scheme used to compress the test pattern.

6. The method of claim 1, wherein the determining and the generating comprises:
    receiving a circuit description of the circuit design;
    using the circuit description, determining respective probabilities that one or more nodes in the circuit design will be set to a selected signal value upon application of one or more test patterns comprising deterministically specified test values for testing targeted faults;

based at least in part on the probabilities, selecting one or more target nodes from the nodes;

determining one or more test-pattern values that cause the target nodes to be set to the selected signal value; and modifying the one or more test patterns comprising deterministically specified test values for testing targeted faults to include at least some of the one or more test-pattern values.

7. The method of claim 6, wherein the nodes having a probability of being set to the selected signal value less than a predetermined threshold are selected as the target nodes.

8. The method of claim 6, wherein, for at least one of the target nodes, a set of multiple test-pattern values is determined, the set of multiple test-pattern values comprising a signal probability enhancing (SPE) cube.

9. The method of claim 6, wherein, for at least one of the target nodes, multiple nonidentical sets of test-pattern values are determined, each nonidentical set of test-pattern values comprising a signal probability enhancing (SPE) cube.

10. The method of claim 6, wherein the nodes having a probability of being set to the selected signal value greater than a predetermined threshold are selected as the target nodes.

11. One or more computer-readable storage media storing computer-executable instructions for causing a computer to perform a method, the method comprising:

determining a first set of one or more test values for testing a circuit design, the first set of test values being configured to enhance a probability that a node associated with an untargeted fault will have a desired value during testing; and generating a test pattern to be applied to the circuit design during testing, the test pattern comprising the first set of test values.

12. The one or more computer-readable storage media of claim 11, wherein the test pattern further comprises a second set of one or more test values for testing the circuit design, the second set of test values being configured to test one or more targeted faults using fault models associated with targeted defects.

13. The one or more computer-readable storage media of claim 12, wherein the targeted faults comprise one or more bridging defects extracted from physical layout data.

14. The one or more computer-readable storage media of claim 11, wherein the determining the first set of one or more test values comprises calculating a probability that the node will have the desired value during application of a previously determined set of test patterns.

15. The one or more computer-readable storage media of claim 11, wherein the generating the test pattern is performed so as not to exceed a maximum number of specified values allowed, the maximum number of specified values allowed being dependent on a compression scheme used to compress the test pattern.

16. The one or more computer-readable storage media of claim 11, wherein the determining and the generating comprises:

receiving a circuit description of the circuit design;

using the circuit description, determining respective probabilities that one or more nodes in the circuit design will be set to a selected signal value upon application of one or more test patterns comprising deterministically specified test values for testing targeted faults;

based at least in part on the probabilities, selecting one or more target nodes from the nodes;

determining one or more test-pattern values that cause the target nodes to be set to the selected signal value; and modifying the one or more test patterns comprising deterministically specified test values for testing targeted faults to include at least some of the one or more test-pattern values.

17. The one or more computer-readable storage media of claim 16, wherein the nodes having a probability of being set to the selected signal value less than a predetermined threshold are selected as the target nodes.

18. The one or more computer-readable storage media of claim 16, wherein, for at least one of the target nodes, a set of multiple test-pattern values is determined, the set of multiple test-pattern values comprising a signal probability enhancing (SPE) cube.

19. The one or more computer-readable storage media of claim 16, wherein, for at least one of the target nodes, multiple nonidentical sets of test-pattern values are determined, each nonidentical set of test-pattern values comprising a signal probability enhancing (SPE) cube.

20. A computer-implemented system, comprising:

means for determining a first set of one or more test values for testing a circuit design, the first set of test values being configured to enhance a probability that a node associated with an untargeted fault will have a desired value during testing;

means for generating a test pattern to be applied to the circuit design during testing, the test pattern comprising the first set of test values; and means for storing the test pattern in one or more computer-readable storage media.

21. The computer-implemented system of claim 20, wherein the test pattern further comprises a second set of one or more test values for testing the circuit design, the second set of test values being configured to test one or more targeted faults using fault models associated with targeted defects.

22. The computer-implemented system of claim 20, wherein the targeted faults comprise one or more bridging defects extracted from physical layout data.

23. The computer-implemented system of claim 20, wherein the means for determining the first set of one or more test values comprises means for calculating a probability that the node will have the desired value during application of a previously determined set of test patterns.

24. The computer-implemented system of claim 20, wherein the means for generating the test pattern generates test patterns so as not to exceed a maximum number of specified values allowed, the maximum number of specified values allowed being dependent on a compression scheme used to compress the test pattern.

* * * * *